(12) United States Patent
Cornell et al.

(10) Patent No.: US 12,331,917 B2
(45) Date of Patent: Jun. 17, 2025

(54) HEAT SINK

(71) Applicant: MILWAUKEE ELECTRIC TOOL CORPORATION, Brookfield, WI (US)

(72) Inventors: Brian Cornell, West Allis, WI (US); Alan Amundson, Milwaukee, WI (US); Duane W. Wenzel, Waukesha, WI (US); Dalton F. Hansen, Whitefish Bay, WI (US); Tyler Young, Waukesha, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 18/395,151

(22) Filed: Dec. 22, 2023

(65) Prior Publication Data
US 2024/0159388 A1 May 16, 2024

Related U.S. Application Data

(63) Continuation of application No. 17/057,268, filed as application No. PCT/US2020/051000 on Sep. 16, 2020, now Pat. No. 11,898,734.
(Continued)

(51) Int. Cl.
*F21V 29/74* (2015.01)
*F21L 4/00* (2006.01)
(Continued)

(52) U.S. Cl.
CPC ............. *F21V 29/74* (2015.01); *F21L 4/00* (2013.01); *F21V 29/508* (2015.01); *F21V 29/60* (2015.01);
(Continued)

(58) Field of Classification Search
CPC ........ F21V 29/74; F21V 29/508; F21V 29/60; F21V 29/71; H02J 7/0042; H02J 7/0063
See application file for complete search history.

(56) References Cited

U.S. PATENT DOCUMENTS

| 5,297,025 A | 3/1994 | Shoquist et al. |
| 5,647,450 A | 7/1997 | Ogawa et al. |

(Continued)

FOREIGN PATENT DOCUMENTS

| CN | 107710547 A | 2/2018 |
| JP | 2009141136 A | 6/2009 |

(Continued)

OTHER PUBLICATIONS

International Search Report and Written Opinion for Application No. PCT/US2020/051000 dated Dec. 21, 2020 (8 pages).
(Continued)

*Primary Examiner* — Zheng Song
(74) *Attorney, Agent, or Firm* — Michael Best & Friedrich LLP

(57) ABSTRACT

A charger for an electrical device (e.g., a site light) includes a housing defining an interior cavity, and one or more openings formed in the housing. A heat sink is disposed in the interior cavity of the housing and is operable to dissipate heat produced in the housing. The heat sink is positioned in a facing relationship with the one or more openings such that the heat sink is at least partially exposed to the exterior. The heat sink is in heat transfer relationship with component of charger electronics of the charger.

13 Claims, 17 Drawing Sheets

Related U.S. Application Data

(60) Provisional application No. 62/901,439, filed on Sep. 17, 2019.

(51) Int. Cl.
  *F21V 29/508* (2015.01)
  *F21V 29/60* (2015.01)
  *F21V 29/71* (2015.01)
  *H02J 7/00* (2006.01)
  *F21W 131/10* (2006.01)

(52) U.S. Cl.
  CPC .......... *F21V 29/71* (2015.01); *H02J 7/0042* (2013.01); *F21W 2131/1005* (2013.01); *H02J 7/0063* (2013.01)

(56) References Cited

U.S. PATENT DOCUMENTS

| | | | |
|---|---|---|---|
| 6,081,423 A | 6/2000 | Griffin | |
| 6,577,098 B2 | 6/2003 | Griffey et al. | |
| 6,636,016 B2 | 10/2003 | Tanaka et al. | |
| 7,241,530 B2 | 7/2007 | Oogami | |
| 7,326,490 B2 | 2/2008 | Moores, Jr. et al. | |
| 7,355,851 B2 | 4/2008 | Lanni | |
| 7,495,415 B2 | 2/2009 | Kanouda et al. | |
| 7,504,804 B2 | 3/2009 | Johnson et al. | |
| 7,626,356 B2 | 12/2009 | Elgie et al. | |
| 7,733,054 B2 | 6/2010 | Phillips et al. | |
| 7,800,901 B2 | 9/2010 | Borowy et al. | |
| 7,816,631 B2 | 10/2010 | Cramer | |
| 7,843,691 B2 | 11/2010 | Reichert et al. | |
| 8,749,197 B2 | 6/2014 | You et al. | |
| 9,620,827 B2 | 4/2017 | Houchin-Miller et al. | |
| 9,899,853 B2 | 2/2018 | Marinov et al. | |
| 10,674,618 B2 | 6/2020 | Choksi | |
| 10,851,976 B2 | 12/2020 | Proeber et al. | |
| 2006/0067051 A1 | 3/2006 | Ku | |
| 2007/0017230 A1 | 1/2007 | Pan | |
| 2007/0139004 A1 | 6/2007 | Satsuma | |
| 2007/0139887 A1 | 6/2007 | Lee et al. | |
| 2008/0266913 A1 | 10/2008 | Brotto et al. | |
| 2009/0021913 A1 | 1/2009 | Kuan | |
| 2011/0101794 A1 | 5/2011 | Schroeder et al. | |
| 2011/0215752 A1 | 9/2011 | Waters et al. | |
| 2011/0279968 A1 | 11/2011 | Lin et al. | |
| 2011/0300420 A1 | 12/2011 | Johnson, Jr. | |
| 2014/0340025 A1 | 11/2014 | Rief | |
| 2014/0362522 A1 | 12/2014 | Degner et al. | |
| 2014/0362552 A1 | 12/2014 | Degner et al. | |
| 2015/0061571 A1 | 3/2015 | Lin | |
| 2015/0077042 A1 | 3/2015 | Seidel et al. | |
| 2015/0077043 A1 | 3/2015 | Seidel et al. | |
| 2015/0084591 A1 | 3/2015 | Kishima et al. | |
| 2015/0155724 A1 | 6/2015 | Han et al. | |
| 2016/0285295 A1 | 9/2016 | Marinov et al. | |
| 2016/0294025 A1 | 10/2016 | Choi et al. | |
| 2017/0332517 A1 | 11/2017 | Gu et al. | |
| 2017/0332522 A1 | 11/2017 | Ushijima | |
| 2017/0341607 A1* | 11/2017 | Sumida | B60L 58/26 |
| 2018/0003370 A1* | 1/2018 | Mandlekar | F21V 15/01 |
| 2018/0191183 A1 | 7/2018 | Namiki | |
| 2018/0324981 A1 | 11/2018 | Murakami et al. | |
| 2018/0376625 A1 | 12/2018 | Truettner et al. | |
| 2019/0027949 A1 | 1/2019 | Critelli | |
| 2019/0075665 A1 | 3/2019 | Choksi et al. | |
| 2019/0296290 A1 | 9/2019 | Hansen et al. | |
| 2019/0326716 A1 | 10/2019 | Nowalis et al. | |
| 2020/0037474 A1 | 1/2020 | Silha et al. | |
| 2020/0288588 A1 | 9/2020 | Choksi et al. | |
| 2020/0288603 A1 | 9/2020 | Patil et al. | |
| 2021/0022272 A1 | 1/2021 | Truettner et al. | |
| 2023/0238814 A1* | 7/2023 | Lu | H01M 10/6551 320/107 |

FOREIGN PATENT DOCUMENTS

| | | |
|---|---|---|
| JP | 2011155056 A | 8/2011 |
| JP | 6136471 B2 | 5/2017 |
| KR | 20190049296 A | 5/2019 |

OTHER PUBLICATIONS

Chinese Patent Office Action for Application No. 202090000851.5 dated Jun. 24, 2022 (2 pages including statement of relevance).
Extended European Search Report for Application No. 20865307.1 dated Dec. 12, 2023 (13 pages).

* cited by examiner

HEAT SINK

CROSS-REFERENCE TO RELATED APPLICATIONS

This application is a continuation of U.S. application Ser. No. 17/057,268, filed on Nov. 20, 2020, which claims priority to U.S. Provisional Patent Application No. 62/901,439 filed on Sep. 17, 2019, the entire contents of which are incorporated herein by reference.

FIELD

The present disclosure relates to heat dissipation in battery-powered electrical devices, and more particularly to heat dissipation by a heat sink in an electrical device.

BACKGROUND

Tools, such as power tools (e.g., drills, drivers, saws, nailers, grinders, etc.), outdoor tools (e.g., trimmers, pole saws, blowers, etc.), etc., and other electrical devices (e.g., site lights, power adapters, motorized devices, non-motorized devices, chargers, etc.) (generally referred to herein as "devices" or a "device") may transfer power (e.g., be powered by, supply power to) with rechargeable battery packs. The battery pack may be detached from a device for charging or for use with other devices. In many cases, battery packs are designed such that the same battery pack may be used with many kinds of devices. During the transfer of power, heat may be produced by electronic components of the devices, such as by power switching elements (e.g., field effect transistors (FETs)).

SUMMARY

When left unmitigated, the heat produced by electronic components of the devices may impact the functionality of the devices. For example, the devices may reach thermal overload and shut down, or components (e.g., electrical components) of the devices may become heated above their rated temperatures and become damaged. Further, some devices include a housing with electronic components therein and the devices are sealed systems (e.g., without venting) to prevent ingress of contaminants (e.g., dust, water, debris, etc.) into the housing. A housing that is plastic or otherwise thermally insulating in a sealed system generally impedes dissipation of heat generated within the housing to an exterior of the housing. Accordingly, various embodiments of heat sinks for devices that are sealed systems and that generate heat are disclosed herein to dissipate heat generated by the devices during the transfer of power, thereby mitigating or avoiding issues caused by heat generated within the devices.

In one construction, a charger is provided which includes a housing that defines an interior cavity and in which one or more openings are formed. A heat sink is disposed in the interior cavity of the housing and is operable to dissipate heat produced in the housing. The heat sink is positioned in facing relationship with the one or more openings such that the heat sink is at least partially exposed to the exterior. The heat sink is in heat transfer relationship with components of charger electronics of the charger.

In another construction, a site light including a main housing with a plurality of inner surfaces defines a first cavity. A charger is supported in the main housing and is positioned within the first cavity. The charger includes a charger housing with one or more openings and a heat sink. The charger defines a charger interior cavity and the heat sink is disposed in the interior cavity. The heat sink is positioned in a facing relationship with the one or more openings such that it is at least partially exposed to an exterior and is in heat transfer relationship with components of charger electronics of the charger.

In yet another construction, a site light including a main housing has a plurality of inner surfaces that define a first cavity. A charger is supported in the main housing and is positioned within the first cavity. The charger includes a charger housing that defines a charger interior cavity and has one or more openings formed in the charger housing. A heat sink is disposed in the charger interior cavity and is operable to dissipate heat produced in the charger housing. The heat sink is positioned in facing relationship with the one or more openings such that it is partially exposed to an exterior. The heat sink is in heat transfer relationship with components of the charger electronics of the charger. The heat sink has one or more fins and at least one fin includes a flange extending from the fin. The flange engages the charger housing at an interface and a seal is disposed between the flange and the charger housing.

Other aspects of the disclosure will become apparent by consideration of the detailed description and accompanying drawings.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. Terms of degree, such as "substantially" or "approximately" are understood by those of ordinary skill to refer to reasonable ranges outside of the given value, for example, general tolerances associated with manufacturing, assembly, and use of the described embodiments. For example, "substantially" can be defined as being within about 5 percent to about 10 percent of a given value.

Illustrated herein are various embodiments of a heat sink for an electrical device operable to dissipate heat produced within a housing of the electrical device.

Figure 1A:
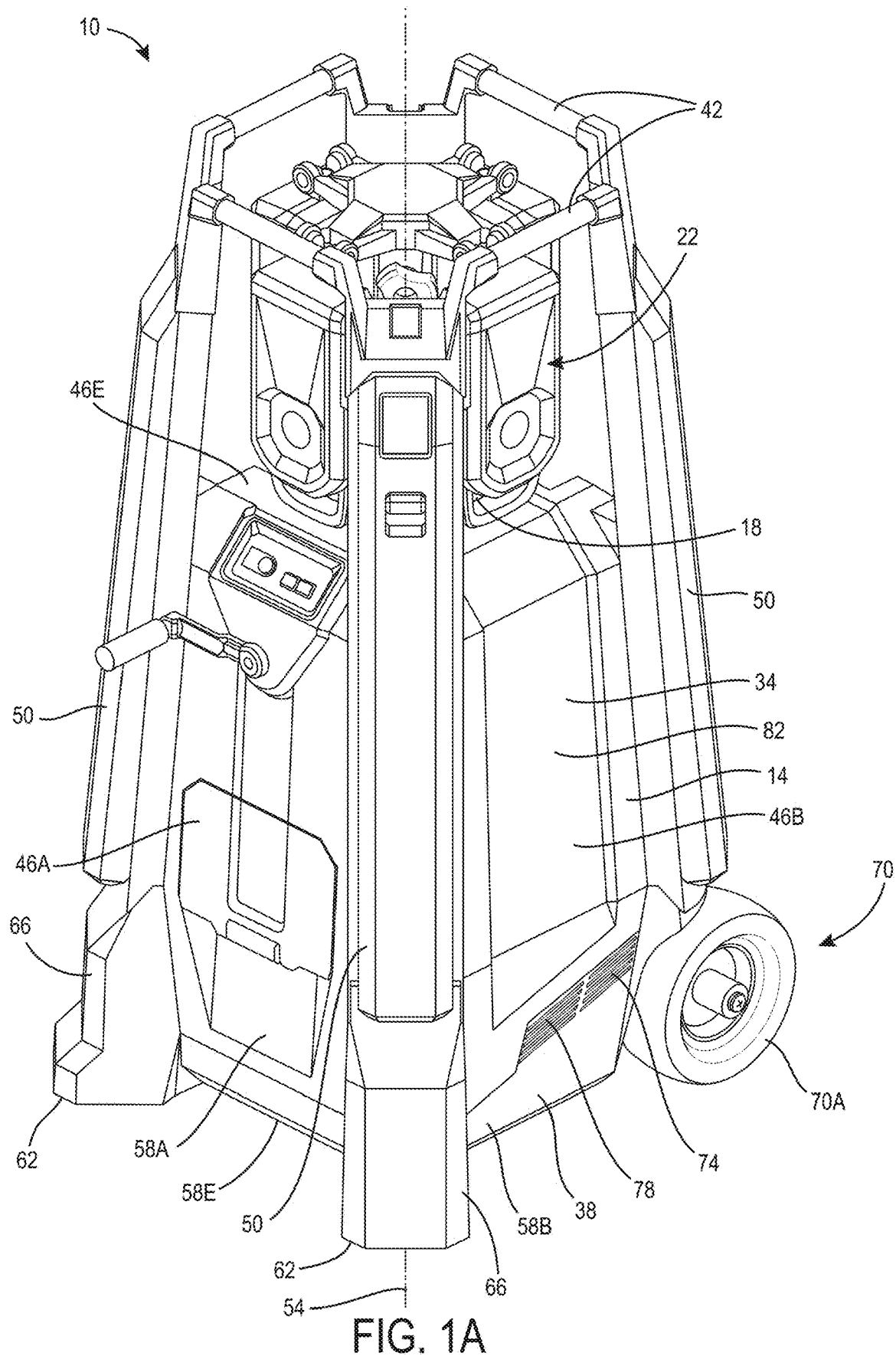
FIG. 1A is a first perspective view of an electrical device, such as a site light, according to one construction of the disclosure.
Figure 1B:
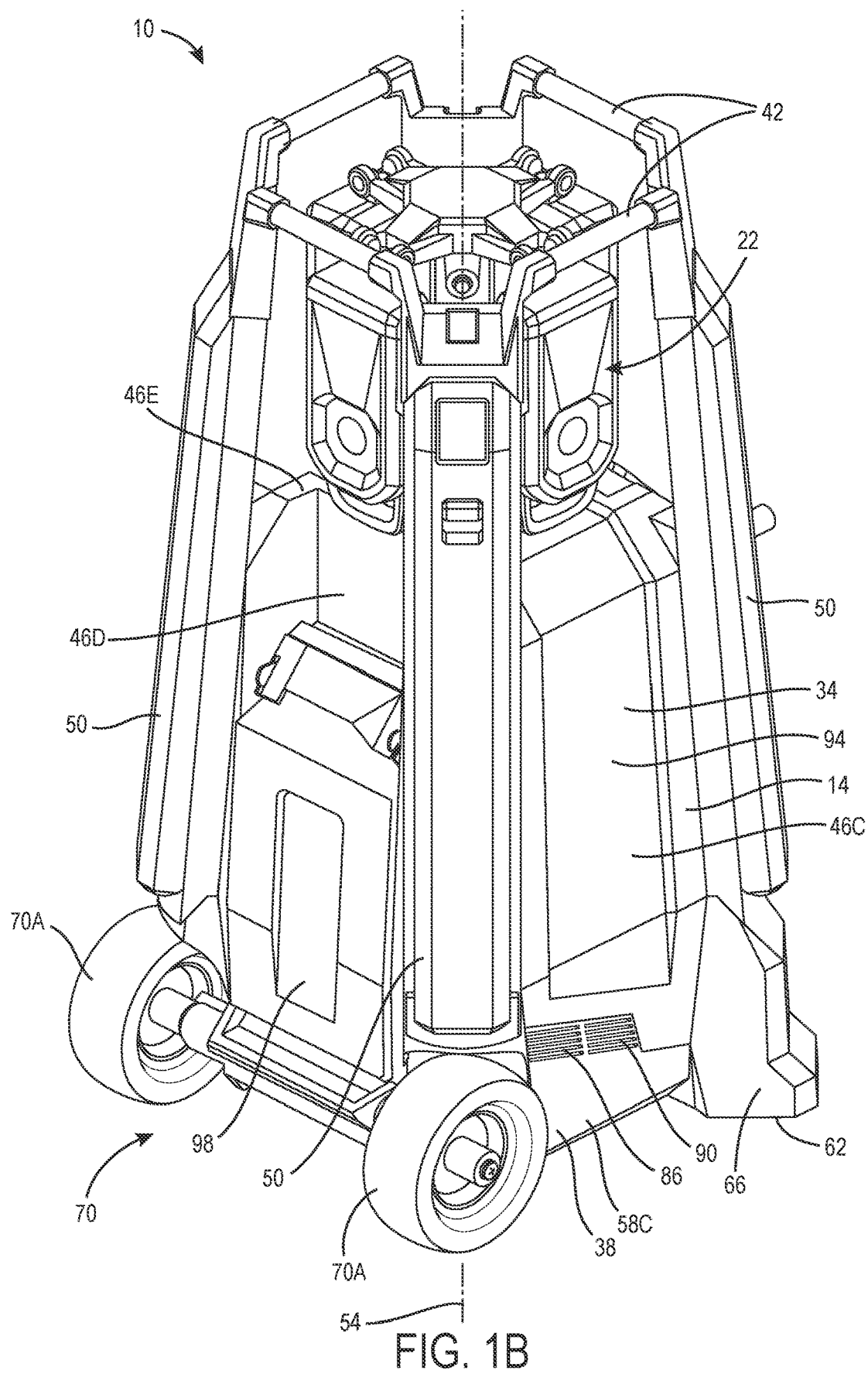
FIG. 1B is a second perspective view of the electrical device of FIG. 1A

FIGS. 1A-1B illustrate a mobile site light 10 for illuminating a jobsite, such as a construction site, or other large area. The site light 10 includes a body 14, a telescopic arm assembly 18 supported by the body 14, and a light assembly 22 coupled to the telescopic arm assembly 18 and movable relative to the body 14. The site light 10 also includes a power system 180 (see FIG. 1C) to provide electrical power to the light assembly 22, and a cooling system 30 (FIG. 2) to regulate the temperature of the power system and the other components of the site light 10.

With continued reference to FIGS. 1A-1B, the body 14 of the site light 10 includes a housing 34, a base 38 supporting the housing 34, and a handle assembly 42 opposite the base 38. The telescopic arm assembly 18 of the site light 10 is coupled to the body 14 and configured to alter the axial distance between the light assembly 22 and the base 38 of the body 14. As shown in FIGS. 1A-1B, the body 14 also includes one or more leg assemblies 50 coupled thereto and configured to provide additional stability and support for the body 14 during use. The body 14 further defines an axis 54 extending therethrough. For operation, the body 14 of the site light 10 is generally placed in an "upright orientation" whereby the axis 54 is maintained in a substantially vertical orientation, as illustrated in FIG. 1A.

The housing 34 includes a plurality of wall panels 46A-46E to at least partially define a housing volume therein. The illustrated housing 34 includes a front panel 46A, a pair of side panels 46B, 46C, a rear panel 46D, and a top panel 46E. The top panel 46E is configured to at least partially support and position the telescopic arm assembly 18 co-axial with the axis 54.

The base 38 of the body 14 includes a plurality of side walls 58A-58E. The side walls 58A-58E are configured to cooperate with the front, rear, and side panels 46A, 46D, and 46B-46C of the housing 34 for at least defining the housing volume. Further, the base 38 includes a bottom wall 58E for defining a bottom of the body 14. In the illustrated embodiment, the housing 34 includes five panels 46A-46E and the base 38 includes five walls 58A-58E, in which one of the walls (e.g., the bottom wall 58E) is opposite one of the panels (e.g., the top panel 46E) for defining the housing volume. The remaining panels (e.g., front, rear, and sides 46A-46D) and walls (e.g., side walls 58A-58D) cooperate to form "sides" of the body 14. In other embodiments, the housing 34 and/or the base 38 may include three or more panels 46, side walls 58, etc. Still further, in other embodiments, the body 14 may be formed as one integral piece such that there is no separate base 38.

The base 38 also includes one or more contact surfaces 62 configured to contact a support surface (e.g., the ground) when the body 14 is in the upright orientation. The base 38 includes one or more integrally formed feet 66, each extending radially outwardly from the side walls 58A-58E of the base 38 to define the respective contact surface 62. Together, the feet 66 are configured to provide stability to the site light 10 by positioning the contact surfaces 62 at an increased radial distance from the axis 54.

As shown in FIGS. 1A-1B, the base 38 of the body 14 further includes a wheel assembly 70 coupled to the base 38 opposite the integrally formed feet 66. During use, the wheel assembly 70 allows the user to roll the site light 10 across the support surface. As such, wheels 70A of the wheel assembly 70 are sized to allow the wheels 70 to roll over uneven ground and small debris, such as but not limited to, gravel, rocks, extension cords, and the like. Furthermore, the wheels 70A are positioned so that when the site light 10 is in the upright orientation, each wheel 70A contacts the support surface and forms a corresponding contact surface. In the illustrated embodiment, the base 38 includes two wheels 70A; however, in alternative embodiments, different numbers of wheels 70A may be used.

As illustrated in FIG. 1A, the body 14 includes an air inlet 74. In the illustrated embodiment, the air inlet 74 is defined by a plurality of slots 78 extending through the side wall 58B of the base 38. In other embodiments, the air inlet 74 may be defined by one of the panels 46A-46D and/or one of the other side walls 58A, 58C-58D. The air inlet 74 is positioned on a first side 82 of the body 14. In other embodiments, the air inlet 74 may be positioned on any one of the sides. The air inlet 74 is configured to allow air to enter the body 14 of the site light 10.

As illustrated in FIG. 1B, the body 14 includes an air outlet 86. In the illustrated embodiment, the air outlet 86 is defined by a plurality of slots 90 extending through the side wall 58C of the base 38. In other embodiments, similar to the air inlet 74, the air outlet 86 may be defined by one of the panels 46A-46D and/or one of the other side walls 58A-58B, 58D. The air outlet 86 is positioned on a second side 94 of the body 14 in which the second side 94 is opposite the first side 82. In other embodiments, the air outlet 86 may be positioned on any one of the sides, and/or may be on the same side as the air inlet 74. The air outlet 86 is configured to allow air to exit the body 14 of the site light 10.

With continued reference to FIG. 1B, the body 14 includes a door 98 to selectively enclose a battery terminal 182 (under the door 98, see also, FIG. 1C) supported by the rear panel 46D. The door 98 is configured to seal the battery terminal off from the surrounding elements. The battery terminal is sized and shaped to receive a rechargeable battery therein. In other embodiments, the battery terminal and the door 98 may be positioned on any other side of the body 14. The housing 34 may also include an AC power input 184 (see FIG. 1C) formed into one of the panels 46A-46D. The battery terminal and the AC power input may be positioned on the same or different sides 82, 94 of the body 14.

Figure 1C:
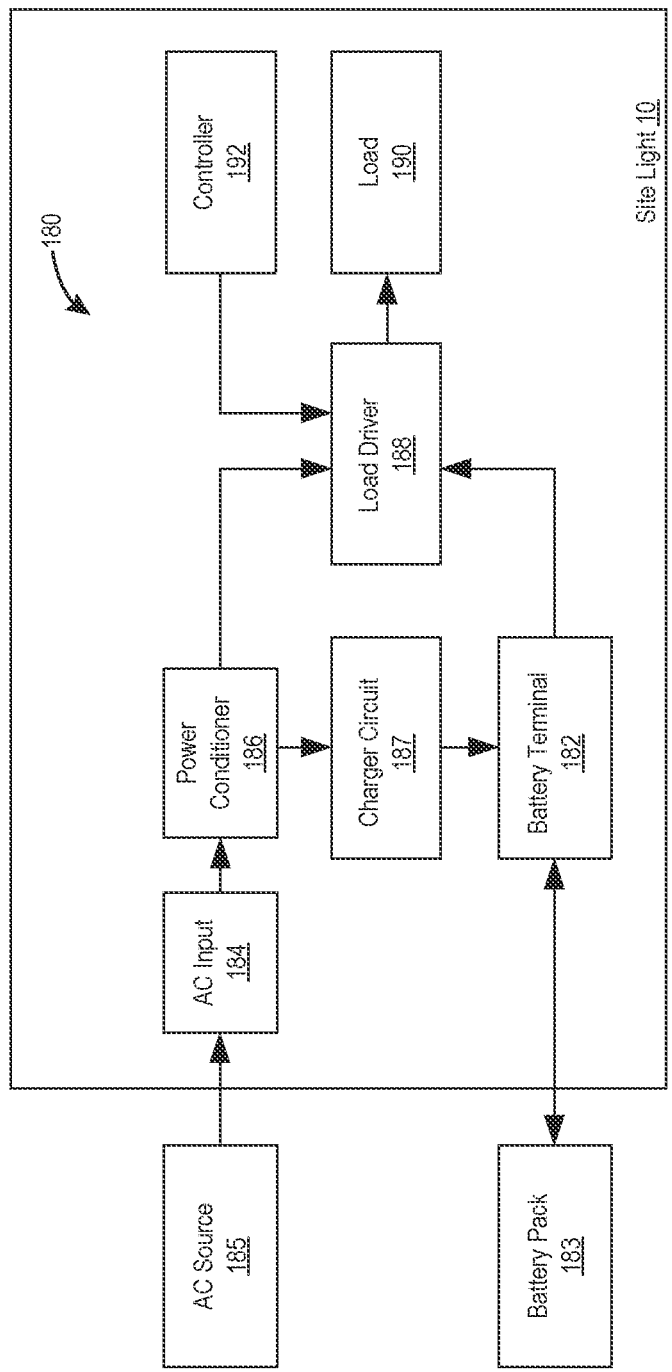
FIG. 1C is a schematic diagram of a power system of the electrical device of FIG. 1A.
Figure 2:
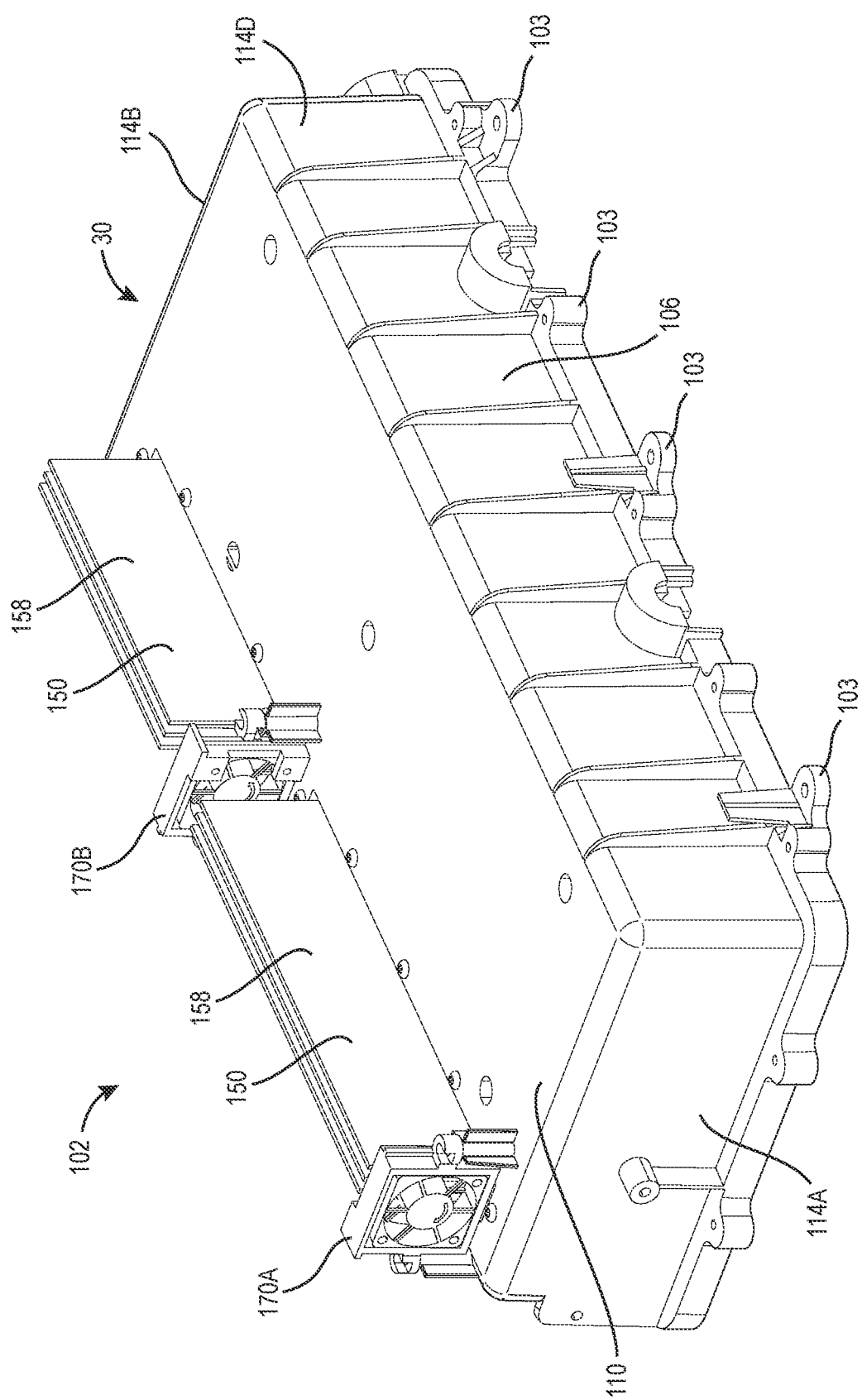
FIG. 2 is a perspective view of a charger of the electrical device of FIG. 1A according to one embodiment of the disclosure, the charger including a heat sink
Figure 3:
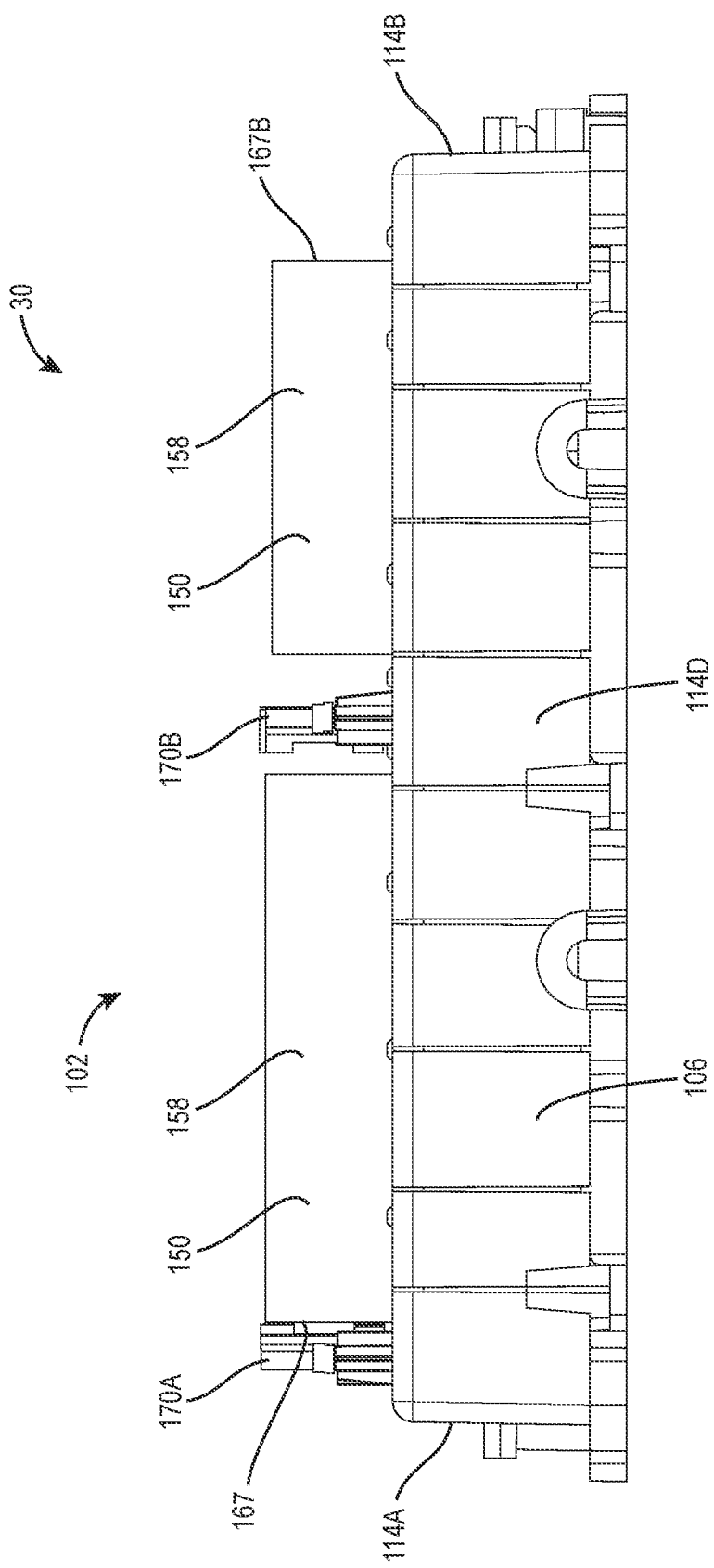
FIG. 3 is a side view of the charger of FIG. 2.

FIG. 1C illustrates a schematic diagram of the power system 180 of the site light 10. The power system 180 includes the battery terminal 182 for engaging a battery pack 183 and the AC power input 184 for engaging an AC source 185 (e.g., via a cord). The AC power input 184 is further coupled to a power conditioner 186, which may include a rectifier circuit and filters to convert AC power to DC power. The power conditioner 186 is further coupled to, and configured to provide DC power to, a charger circuit 187 and a load driver 188. The battery terminal 182 is also coupled to the charger circuit 187 and configured to receive charging current from the charger circuit 187 and provide the charging current to the battery pack 183. The battery terminal 182 is further coupled to the load driver 188 and configured to provide DC current discharging from the battery pack 183 to the load driver 188. The load driver 188 is configured to provide power, received from the power conditioner 186 or the battery terminal 182, to the load 190.

During operation, the power system 180 is operable in at least two modes of operation: a first mode of operation, where the power system 180 receives power from the AC source 185, and a second mode of operation, where the power system 180 receives power from the battery pack 183. When working in the first mode of operation, the power system 180 is configured to both power the load 190 (e.g., the light assembly 22) and recharge the battery pack 183 (when present). More particularly, when in the first mode of operation, the AC input 184 receives AC power from the AC source 185 and provides the AC power to the power conditioner 186. The power conditioner 186 rectifies and filters the AC power to produce and output DC power to the charger circuit 187 and the load driver 188. The charger circuit 187 uses the DC power and provides charging current to the battery pack 183 (when present) via the battery terminal 182. The load driver 188 provides the DC power to the load 190 in accordance with control signals from a controller 192. The load driver 188 includes, for example, power switching elements to selectively apply power to the load 190 from the power conditioner 186, when available (first mode of operation), or from the battery pack 183 when available and power from the power conditioner 186 is not available (second mode of operation). The load 190 includes, for example, one or more light emitting diodes or other illumination elements that provide the output light of the site light 10 to illuminate a job site. The controller 192 is, for example, a microcontroller including a memory and an electronic processor that executions instructions stored on the memory to implement functions of the site light 10. The controller 192 may also control the power conditioner 186 and the charger circuit 187 to condition AC power and provide charging current, respectively, as described. In some embodiments, the controller 192 is implemented as multiple sub-controllers, for example, one sub-controller for each of the power conditioner 186, the charger circuit 187, and the load driver 188, with each having a separate electronic processor and memory, or one sub-controller for the power conditioner 186 and the charger circuit 187, and one sub-controller for the load driver 188. While not illustrated, the power system 180 may also draw power from other devices such as, but not limited to, a solar panel, a fuel cell, and other suitable sources of power.

With reference to FIGS. 2-5, the site light 10 includes a charger unit 102, which includes the charger circuit 187, positioned within the housing volume of the body 14. The charger unit 102 is coupled to and supported by the body 14 via mounting elements 103. For example, fasteners (not shown) pass through through-holes of the mounting elements 103 and engage threaded bosses (not shown) on an inner surface of one of the panels 46A-D. In the illustrated embodiment, the charger unit 102 is positioned closer to the second side (e.g., second side 94 having the air outlet 86) than the first side 82 (e.g., side having the air inlet 74). For example, the charger unit 102 is mounted to the inner surface of the panel 46C within the housing volume of the body 14. In other embodiments, the charger unit 102 may be positioned proximate any one of the sides 82, 94 of the body 14.

The charger unit 102 includes a housing 106 having a plurality of walls 110, 114A-114D defining a charger volume 118 therein. In particular, the walls 110, 114A-114D have inner surfaces 122 (FIGS. 4-5) defining an interior cavity 126 of the charger housing 106. Further, an exterior may be defined as space outside of the charger housing 106. The illustrated charger housing 106 includes five walls 110, 114A-114D forming a generally rectangular shape. Specifically, the charger housing 106 includes a side wall 110, a first end wall 114A, a second end wall 114B opposite the first end wall 114A, a third end wall 114C extending between the first and second end walls 114A, 114B, and a fourth end wall 114D opposite the third end wall 114C. The charger unit 102 is coupled to an inner surface of the second side 94 (i.e., the side panel 58C) such that a sixth wall of the charger 102 may be formed by the body 14 of the site light 10. Accordingly, the interior cavity 126 is formed by the charger housing 106 and the body 14 of the site light 10. In other embodiments, the charger unit 102 may be formed by one single piece defining the interior cavity 126 therein.

Figure 5:
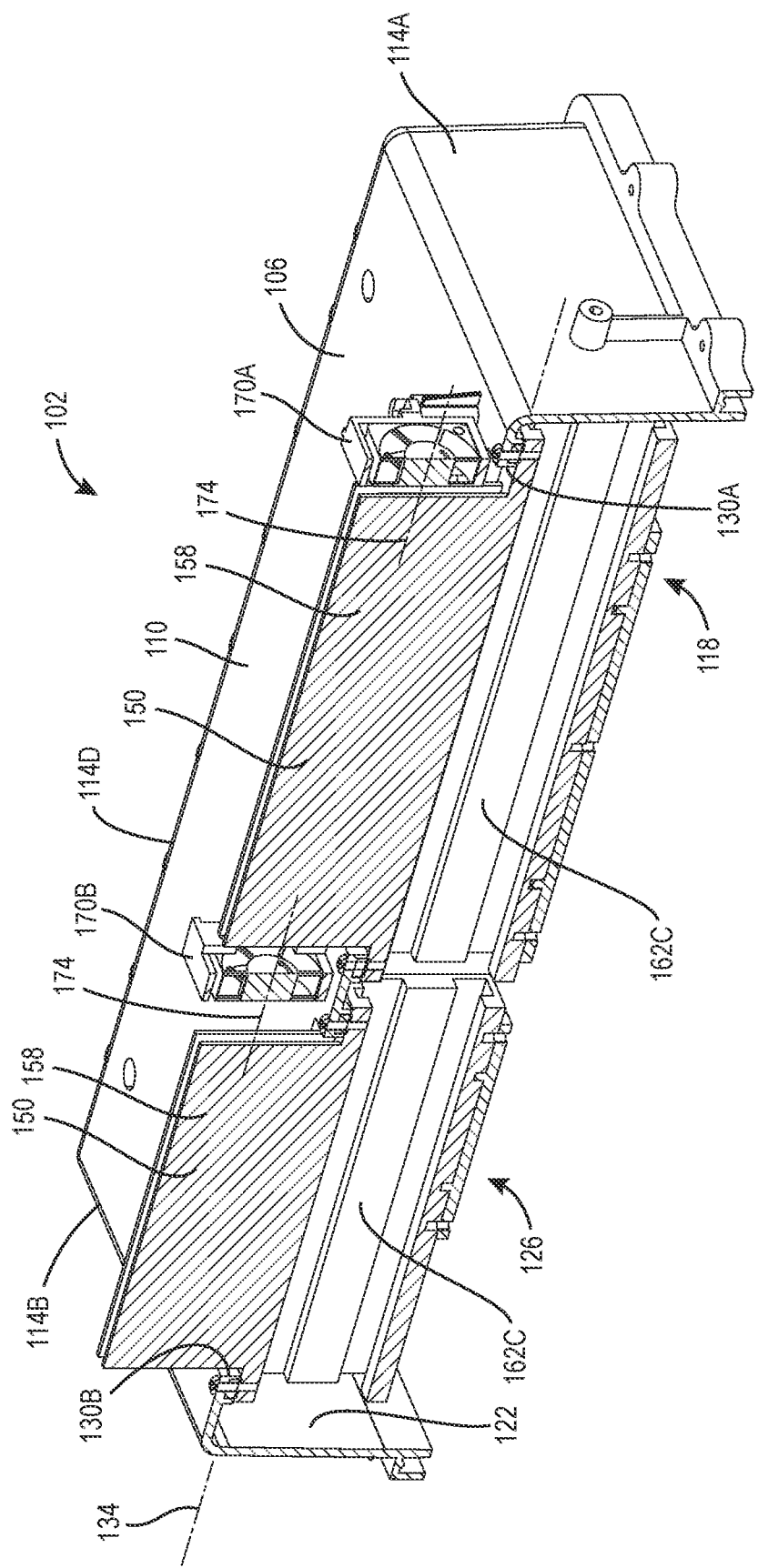
FIG. 5 is a second perspective, cross-sectional view of the charger of FIG. 2.
Figure 6:
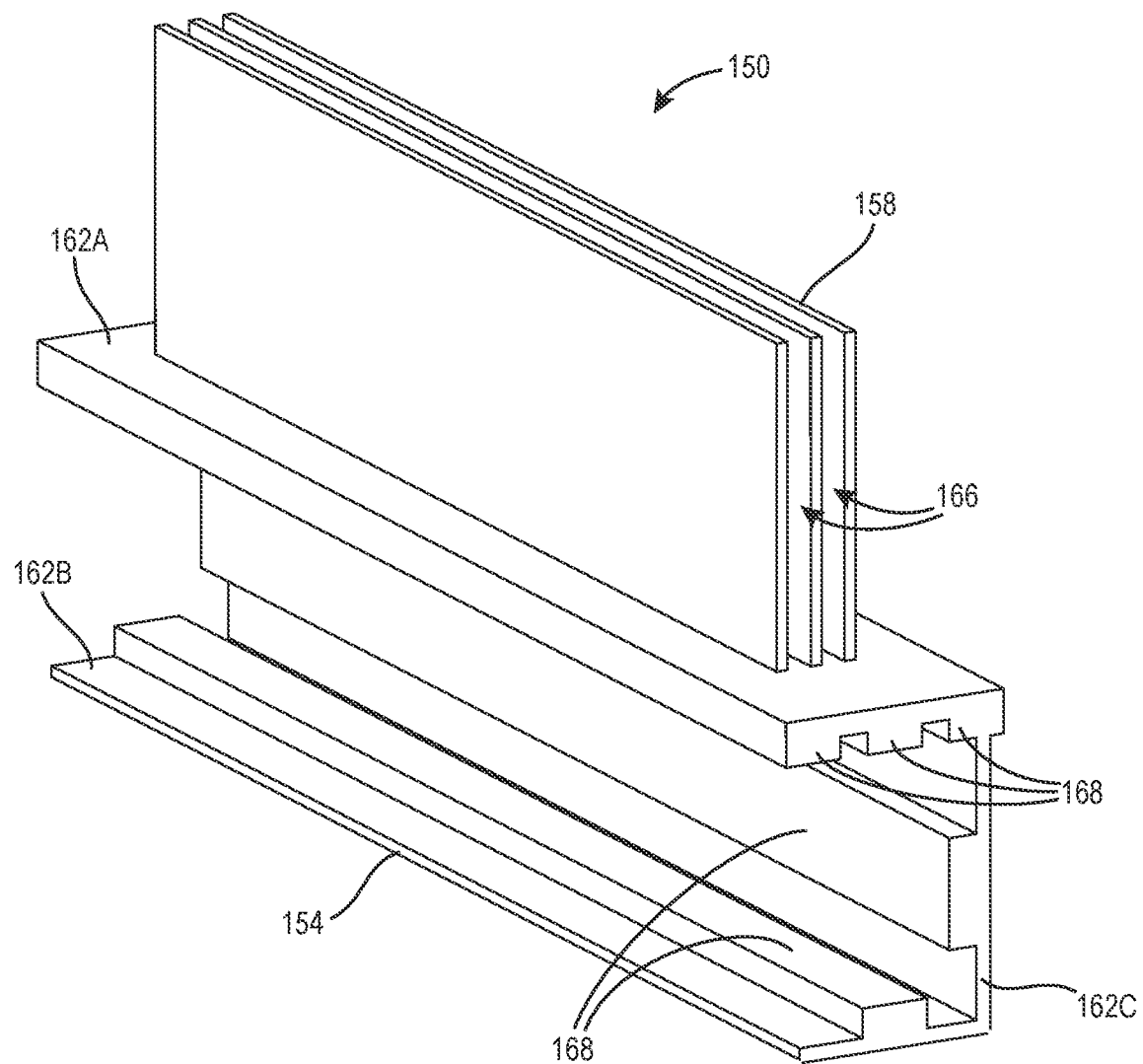
FIG. 6 is a perspective view of the heat sink of FIG. 2.

With particular reference to FIG. 5, the charger housing 106 includes a plurality of openings 130A, 130B. In the illustrated embodiment, the housing 106 includes a first opening 130A and a second opening 130B defined by the side wall 110. In other embodiments, the charger housing 106 may include one or more openings positioned on any one of the walls 114A-114D of the charger housing 106. The illustrated first and second openings 130A, 130B are aligned along a longitudinal axis 134 extending through the first end wall 114A and the second end wall 114B of the charger housing 106. Further, the illustrated openings 130A, 130B are positioned closer to the third end wall 114C than the fourth end wall 114D. In other embodiments, the openings 130A, 130B may or may not be aligned, and may be positioned proximate the same or different walls 11A-114D.

The charger 102 includes one or more electrical components including, for example, the printed circuit board (PCB) 138 positioned within the interior cavity 126 (FIG. 4) and the elements thereon. The electrical components on the PCB 138 (also referred to as the charger electronics) include, for example, one or both of the power conditioner 186 and charger circuit 187 of the power system 180, which are electrically connected to the battery terminal 182 and the AC power input 184, respectively.

As illustrated in FIGS. 4-7, the charger 102 further includes a heat dissipating structure or heat sink 150. The heat sink 150 is supported by the charger housing 106 and thereby the body 14 of the site light 10. The illustrated heat sink 150 includes a first, C-shaped portion 154, and a second, finned portion 158 extending from the C-shaped portion 154. More specifically, C-shaped portion 154 includes a first section 162A, a second section 162B spaced from the first section 162A, and an intermediate section 162C extending therebetween to form a "C" shape. The finned portion 158 includes three fins extending away from the first section 162A. In other embodiments, the first portion 154 may include one or more sections to form any polygonal shape (e.g., square, triangle, etc.), and the second portion 158 may include one or more fins extending from the first section 162A. The fins define a plurality of air channels 166 extending from a first end 167A of the second portion 158 to a second, opposite end 167B.

Figure 4:
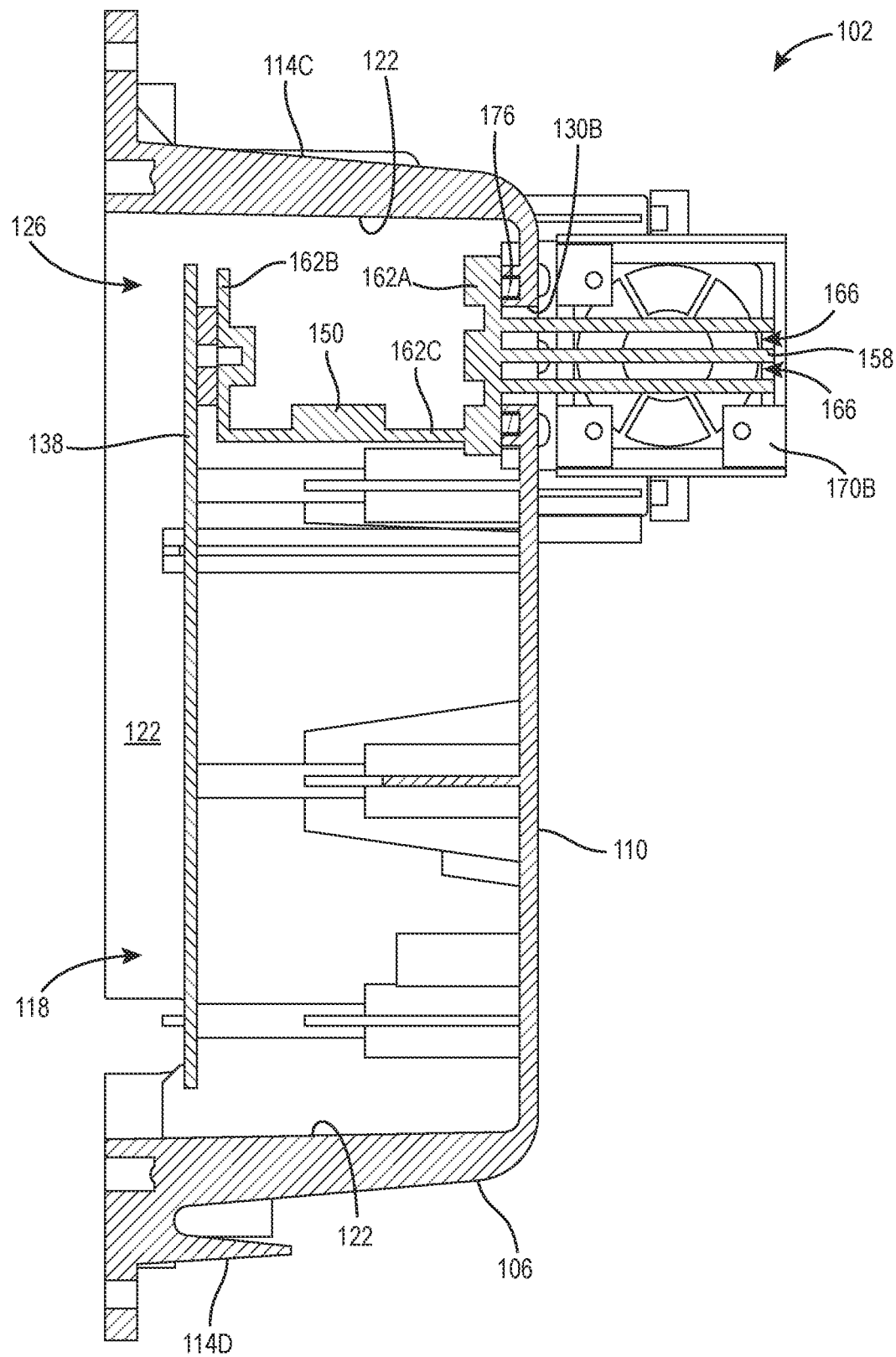
FIG. 4 is a first cross-sectional view of the charger of FIG. 2.

With particular reference to FIGS. 4 and 5, the first portion 154 is positioned within the interior cavity 126 of the charger housing 106, and the second portion 158 extends therefrom through the plurality of openings 130A-130B to the exterior of the charger housing 106. Accordingly, the heat sink 150 is at least partially exposed to the exterior of the charger housing 106. Said another way, the first portion 154 is in facing relationship with the inner surfaces 122 of the charger housing 106. The second portion 158 is in facing relationship with the exterior of the charger housing 106. The second portion 158 (i.e., the fins) extend form the first section 162A in a direction substantially perpendicular to the longitudinal axis 134 defined by the openings 130A, 130B.

Further, the illustrated charger 102 includes two heat sinks 150. Each of the heat sinks 150 have a similar shape with each having the first, C-shaped portion 154 within the interior cavity 126 and the second, finned portion 158 extending through one of the openings 130A, 130B, respectively. Further, as illustrated, the heat sink 150 that extends through the opening 130A is longer in the axial direction (along the axis 134) than the heat sink 150 that extends through the opening 130B. However, in other embodiments, the heat sinks 150 have the same axial length, or the heat sink 150 that extends through the opening 130A has a shorter axial length than the heat sink 150 that extends through the opening 130B.

Figure 7:
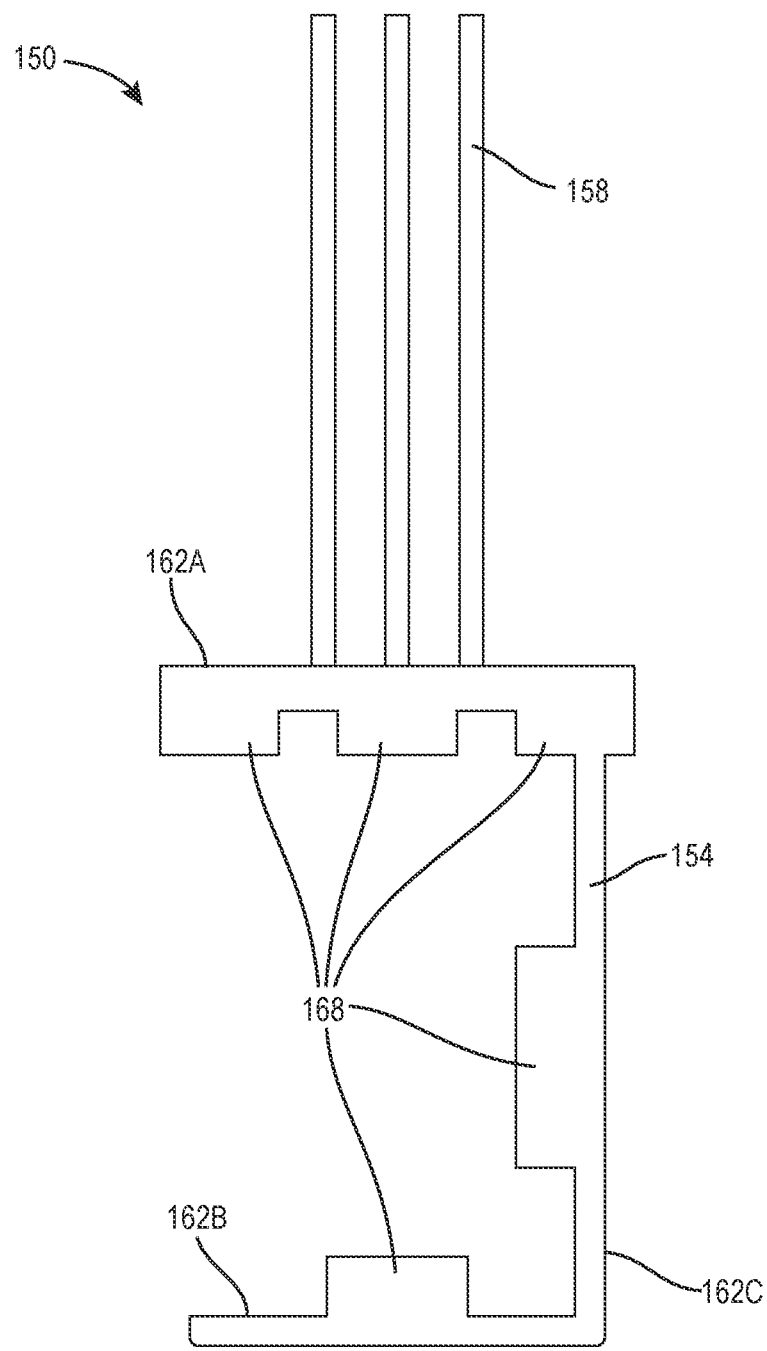
FIG. 7 is an end view of the heat sink of FIG. 6.

In addition, each illustrated heat sink 150 has a plurality of ribs 168 (FIG. 7). The ribs 168 are configured to increase a surface area of the heat sink 150 thereby increasing heat dissipation. In the illustrated embodiment, the first section 162A includes three ribs 168, and each of the second section 162B and the intermediate section 162C includes one rib 168. In other embodiments, the charger 102 may include one or more heat sink 150 and one or more ribs 168.

With reference to FIG. 4, the first portion 154 (e.g., the second section 162B) is coupled to the PCB 138 of the charger 102. Further, the first portion 154 is in heat transfer relationship with components of charger electronics (e.g., circuit components, such as field effect transistors, of the PCB 138) of the charger 102. The heat sink 150 is operable to dissipate heat produced in the charger housing 106.

With reference to FIGS. 2-5, the charger 102 further includes a plurality of fans 170A, 170B. The illustrated charger 102 includes a first fan 170A and a second fan 170B, each positioned on the side wall 110 of the charger housing 106. In other embodiments, the charger 102 may include one or more fans, positioned on the same or different walls 110, 114A-114D of the charger housing 106. The fans 170A, 170B are coupled to and supported by the charger housing 106. Specifically, the second portion 158 of the heat sink 150, and the plurality of fans 170A, 170B are positioned exterior to the charger housing 106, and the first portion 154 of the heat sink 150 is positioned in the interior cavity 126 of the charger housing 106.

Each fan 170A, 170B includes a rotational axis 174 extending parallel with the longitudinal axis 134 of the openings 130A, 130B (FIG. 5). In particular, each fan 170A, 170B is aligned with the air channels 166 of the finned portion 158 of the heat sink 150. The fans 170A, 170B are configured to draw air through the air channels 166 and pass the air over the finned portion 158 of the heat sink 150. The one or more fans 170A, 170B is configured to facilitate heat dissipation in the charger housing 106. As such, the cooling system 30 of the site light 10 includes the heat sink 150 extending at least partially through the plurality of openings 130A, 130B, and the fans 170A, 170B drawing air past the second portion 158 of the heat sink 150.

In the illustrated embodiment, the fans 170A, 170B are configured to draw air through the air inlet 74 into the housing volume of the body 14 of the site light 10. The fans 170A, 170B are further configured to draw the air over the second portion 158 of the heat sink 150, and subsequently direct the air to the air outlet 86 of the body 14. A seal 176 (FIG. 4) may also be provided between the first section 162A of the C-shaped portion 154 and a portion of the side wall 110 to inhibit the ingress of debris, water, dust, etc. into the charger housing 106. For example, the seal 176 may be a compressible gasket. As such, the second portion 158 of the heat sink 150 is in thermal communication with, but fluidly isolated from the electrical components (e.g., PCB 138) of the charger housing 106. Further, in the illustrated embodiment, the interior cavity 126/charger volume 118 of the charger 102 is fluidly isolated from the surrounding atmosphere that is exterior of the charger housing 106. Thus, contaminants (e.g., debris, water, dust, etc.) that may enter the housing volume of the body 14 of the site light 10 via the inlet 78 or outlet 86 are prevented from entering the charger housing 106. Because the interior cavity 126 is fluidly isolated from the exterior of the charger housing 106, the charger 102 may be referred to as a sealed system.

In other embodiments, a rotation of the fans 170A, 170B may be reversed such that the air inlet 78 is the air outlet 86 and vice versa. Regardless of the fan rotation direction, air is forced (i.e., pushed or drawn) through the air channels 166 by the fans 170A, 170B.

Figure 8A:
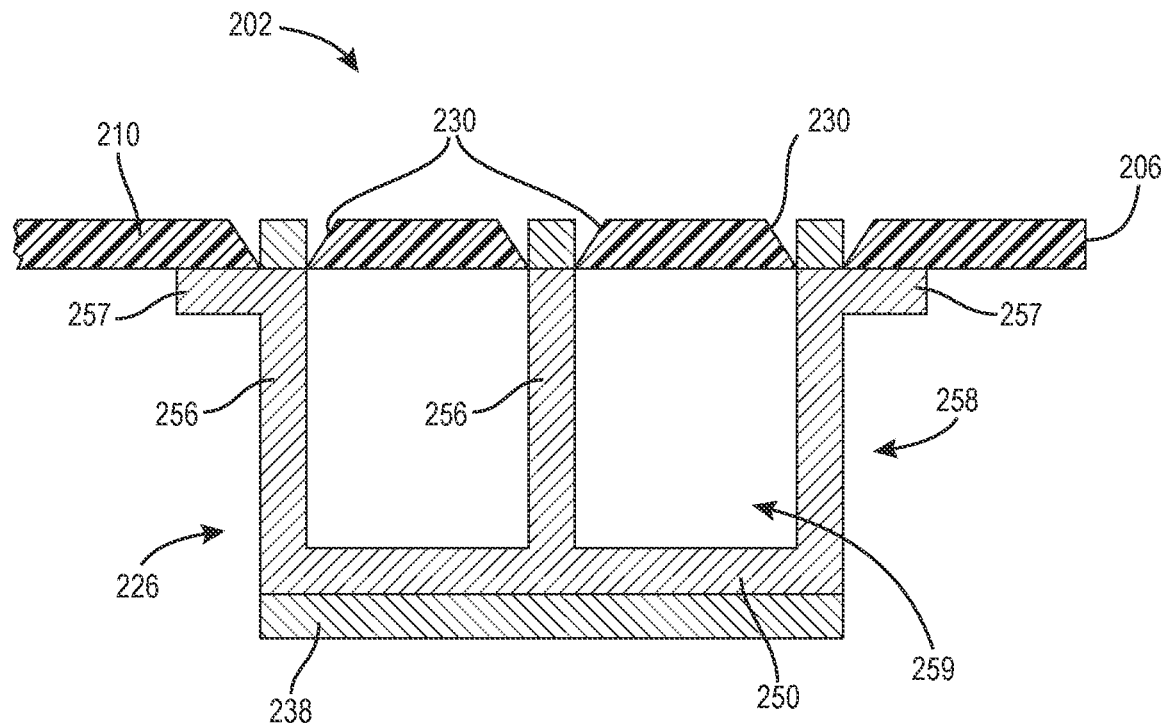
FIG. 8A is a schematic cross-sectional view of a portion of another charger according to a second embodiment of the disclosure.
Figure 8B:
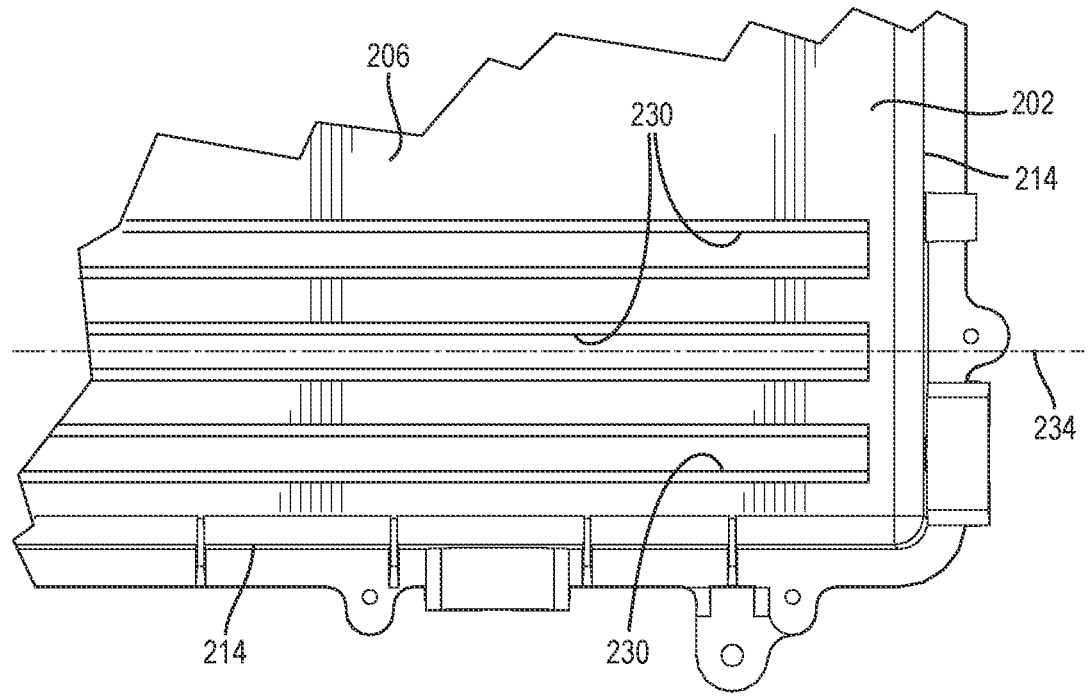
FIG. 8B is a top view of the charger of FIG. 8A, with the heat sink removed.

FIGS. 8A-8B illustrate a portion of another embodiment of a charger unit 202, with like components and features as the embodiment of the charger unit 102 shown in FIGS. 2-7 being labeled with like reference numerals plus "100." The charger unit 202 is similar to the charger 102 and, accordingly, the discussion of the charger 102 above similarly applies to the charger unit 202 and is not re-stated. Rather, only differences between the charger unit 202 and the charger unit 102 are specifically noted herein, such as differences in the heat sink and charger housing openings.

The charger unit 202 includes a housing 206 having a plurality of walls 210, 214. Further, the wall 210 defines a plurality of openings 230 in which the openings 230 extend along parallel with a longitudinal axis 234. A heat sink 250 is positioned within an interior cavity 226 of the charger 202. Fins 256 of a finned portion 258 of the heat sink 250 extend parallel with the longitudinal axis 234 of the openings 230 such that the respective fin 256 extends along a length of the respective opening 230. The illustrated charger 202 includes three openings 230; however, in other embodiments, the charger 202 may include one or more openings. For example, the charger 202 may include one, two, or four openings 230. The number of fins 256 of the heat sink 250 correspond to the number of openings 230. The fins 256 are in facing relationship with an exterior of the charger 202. The fins 256 do not extend through the respective openings 230. Further, the heat sink 250, in some embodiments, is mounted to a PCB 238 having charger electronics thereon, similar to the PCB 138. Additionally, in some embodiments, a seal (not shown) is included at the interface of flanges 257 of the heat sink 250 and the wall 210, such that the charger unit 202 is a sealed system. In other words, an interior cavity 259 of the heat sink 250 and the fins 256 are in fluid and thermal communication with the openings 230, the exterior of the housing 206, and the housing volume of the body 14 of the site light 10 in which the charger 202 is mounted. Additionally, the charger electronics and PCB 238 are in thermal communication (via the heat sink 250 and openings 230) with the exterior of the housing 206 and the housing volume of the body 14 of the site light 10, but are sealed from (i.e., not in fluid communication with) the exterior of the housing 206 and the housing volume of the body 14. In some embodiments, integral end caps are provided on axial ends of the heat sink 250, or the axial ends of the heat sink 250 abut the side walls of the housing 206, to further seal the interior cavity 259 of the heat sink 250 from the rest of the interior cavity 226 of the charger 202 having the PCB 238 and charger electronics.

Figure 9A:
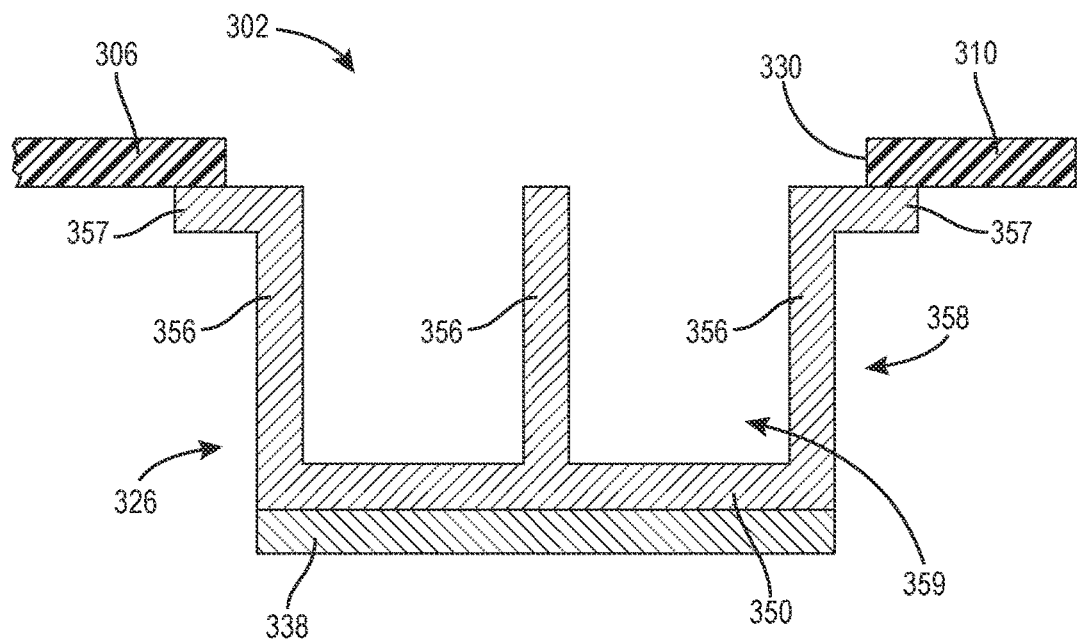
FIG. 9A is a schematic cross-sectional view of a portion of yet another charger according to a third embodiment of the disclosure.
Figure 9B:
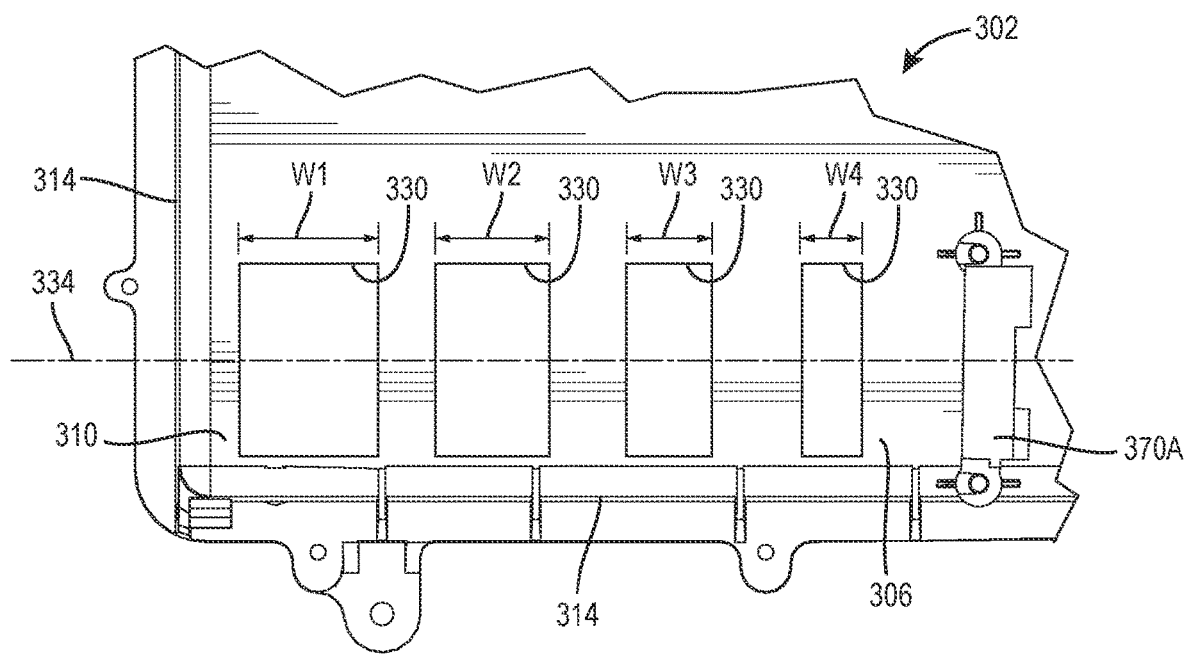
FIG. 9B is a top view of the charger of FIG. 9A, with the heat sink removed.

FIGS. 9A-9B illustrate a portion of a third embodiment of a charger unit 302, with like components and features as the embodiment of the charger unit 102 shown in FIGS. 2-7 being labeled with like reference numerals plus "200." The charger unit 302 is similar to the charger 102 and, accordingly, the discussion of the charger 102 above similarly applies to the charger unit 302 and is not re-stated. Rather, only differences between the charger unit 302 and the first charger 102 are specifically noted herein, such as differences in the heat sink and charger housing openings.

The charger unit 302 includes a housing 306 having a plurality of walls 310, 314. Further, the wall 310 defines a plurality of openings 330 in which each of the openings 330 extend perpendicular to a longitudinal axis 334 of the charger housing 306. A heat sink 350 is positioned within an interior cavity 326 of the charger 302. Fins 356 of a finned portion 358 of the heat sink 350 extend parallel with the longitudinal axis 334 of the openings 330 such that each fin 356 extends perpendicular to the respective opening 330. The illustrated charger 302 includes four openings 330; however, in other embodiments, the charger 302 may include one or more openings 330. For example, the charger 302 may include one, two, three, or five openings 330. The number of fins 356 of the heat sink 350 may or may not correspond to the number of openings 330. The fins 356 are in facing relationship with an exterior of the charger 302. The fins 356 do not extend through the respective openings 330.

Further, the heat sink 350, in some embodiments, is mounted to a PCB 338 having charger electronics thereon, similar to the PCB 138. Additionally, in some embodiments, a seal (not shown) is included at an interface of flanges 357 of the heat sink 350 and the wall 310, such that the charger unit 302 is a sealed system. In other words, an interior cavity 359 of the heat sink 350 and the fins 356 are in fluid and thermal communication with the openings 330, the exterior of the housing 306, and the housing volume of the body 14 of the site light 10 in which the charger 302 is mounted. Additionally, the charger electronics and PCB 338 are in thermal communication (via the heat sink 350 and openings 330) with the exterior of the housing 306 and the housing volume of the body 14 of the site light 10, but are sealed from (i.e., not in fluid communication with) the exterior of the housing 306 and the housing volume of the body 14. In some embodiments, integral end caps (not shown) are provided on axial ends of the heat sink 350, or the axial ends of the heat sink 350 abut the side walls of the housing 306, to further seal the interior cavity 359 of the heat sink 350 from the rest of the interior cavity 326 of the charger 302 having the PCB 338 and charger electronics.

Further, each opening 230 includes a width W1, W2, W3, W4 defined as extending partially along a direction of the longitudinal axis 334. As a position of each respective opening 330 becomes closer to a fan 370A (shown schematically) relative to the longitudinal axis 334, the width W1, W2, W3, W4 becomes smaller. For example, as shown in FIG. 9B, the opening 330 adjacent the fan 370A has a width W4 that is smaller than the respective widths W1, W2, W3 of the other openings 330. This size variation in openings 330 may better facilitate the flow of air across the fins 356 of the heat sink 350.

Figure 10:
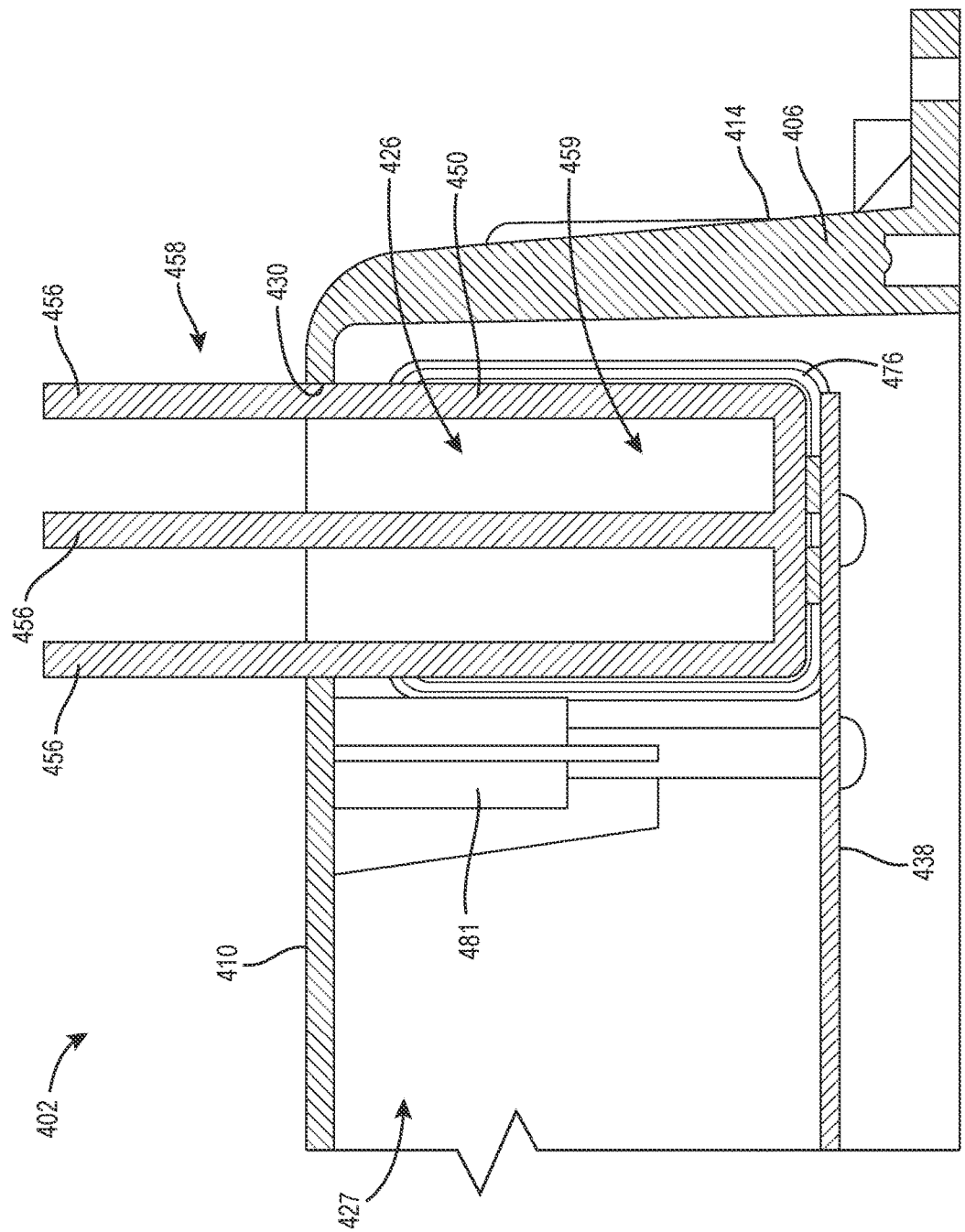
FIG. 10 is a cross-sectional view of a portion of yet still another charger according to a fourth embodiment of the disclosure.

FIG. 10 illustrates a portion of a fourth embodiment of a charger unit 402, with like components and features as the embodiment of the charger unit 102 shown in FIGS. 2-7 being labeled with like reference numerals plus "300." The charger unit 402 is similar to the charger 102 and, accordingly, the discussion of the charger 102 above similarly applies to the charger unit 402 and is not re-stated. Rather, only differences between the charger unit 402 and the charger unit 102 are specifically noted herein, such as differences in the heat sink and charger housing openings.

The charger unit 402 includes a housing 406 having a plurality of walls 410, 414. Further, the wall 410 defines an opening 430. A heat sink 450 is positioned within a first interior cavity 426 of the charger 402. In particular, the first interior cavity 426 is defined by an internal housing member 481 that extends from an inner surface of the wall 410 toward the opposite side of the housing 406. The internal housing member 481 is spaced from and parallel to one of the walls 414 such that the first interior cavity 426 is at least partially defined between the internal housing member 481 and the wall 414. More specifically, the internal housing member 481 separates a housing volume of the housing 406 into the first interior cavity 426 and a second interior cavity 427 (only a portion of which is shown). The heat sink 450 is supported within and extends through the interior cavity 426. More specifically, fins 456 of a finned portion 458 of the heat sink 450 extend through the interior cavity 426 and through the opening 430. As such, the fins 456 extend past the wall 410. Said another way, the fins 456 extend through a "side" of the housing 406.

Further, the heat sink 450, in some embodiments, is mounted to a PCB 438 having charger electronics thereon, similar to the PCB 138. In the illustrated embodiment, the PCB 438 is partially positioned within each of the first and second interior cavities 426, 427. Additionally, in some embodiments, a seal 476 is included at an interface of the internal housing member 481 and the heat sink 450, and an interface of the PCB 438 and the heat sink 450, such that the charger unit 402 is a sealed system. In other words, an interior cavity 459 of the heat sink 450 and the fins 456 are in fluid and thermal communication with the openings 430 and an exterior of the housing 406. Additionally, the charger electronics and PCB 438 are in thermal communication (via the heat sink 450 and openings 430) with the exterior of the housing 406, but are sealed from (i.e., not in fluid communication with) the exterior of the housing 406 and the first interior cavity 426.

Figure 11:
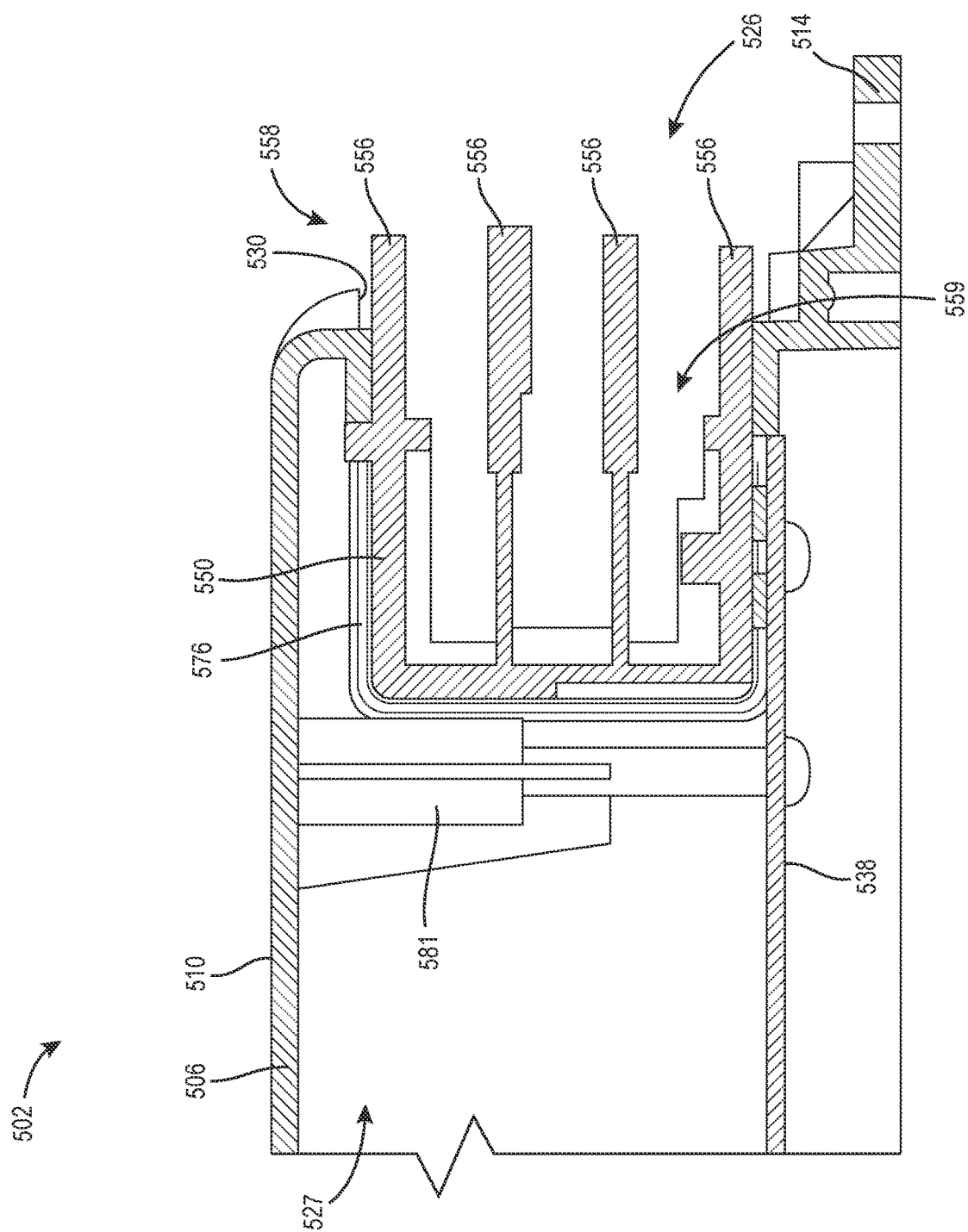
FIG. 11 is a cross-sectional view of a portion of another charger according to a fifth embodiment of the disclosure.

FIG. 11 illustrates a portion of a fifth embodiment of a charger unit 502, with like components and features as the embodiment of the charger unit 102 shown in FIGS. 2-7 being labeled with like reference numerals plus "400." The charger unit 502 is similar to the charger 102 and, accordingly, the discussion of the charger 102 above similarly applies to the charger unit 502 and is not re-stated. Rather, only differences between the charger unit 502 and the charger unit 102 are specifically noted herein, such as differences in the heat sink and charger housing openings.

The charger unit 502 includes a housing 506 having a plurality of walls 510, 514. Further, the wall 514 defines an opening 530. A heat sink 550 is positioned within a first interior cavity 526 of the charger 502. In particular, the first interior cavity 526 is defined by an internal housing member 581 that extends from an inner surface of the wall 510 toward the opposite side of the housing 506. The internal housing member 581 is spaced from and parallel to one of the walls 514 such that the first interior cavity 526 is at least partially defined between the internal housing member 581 and the wall 514. More specifically, the internal housing member 581 separates a housing volume of the housing 506 into the first interior cavity 526 and a second interior cavity 527 (only a portion of which is shown). The heat sink 550 is supported within and extends through the interior cavity 526. More specifically, fins 556 of a finned portion 558 of the heat sink 550 extend through the interior cavity 526 and through the opening 530. As such, the fins 556 extend past the wall 514. Said another way, the fins 556 extend through an "end" of the housing 506.

Further, the heat sink 550, in some embodiments, is mounted to a PCB 538 having charger electronics thereon, similar to the PCB 138. In the illustrated embodiment, the PCB 538 is partially positioned within the first and second interior cavities 526, 527. Additionally, in some embodiments, a seal 576 is included at an interface of the internal housing member 581 and the heat sink 550, and an interface of the PCB 538 and the heat sink 550, such that the charger unit 502 is a sealed system. In other words, an interior cavity 559 of the heat sink 550 and the fins 556 are in fluid and thermal communication with the openings 530 and an exterior of the housing 506. Additionally, the charger electronics and PCB 538 are in thermal communication (via the heat sink 550 and openings 530) with the exterior of the housing 506, but are sealed from (i.e., not in fluid communication with) the exterior of the housing 506 and the first interior cavity 526.

Figure 12:
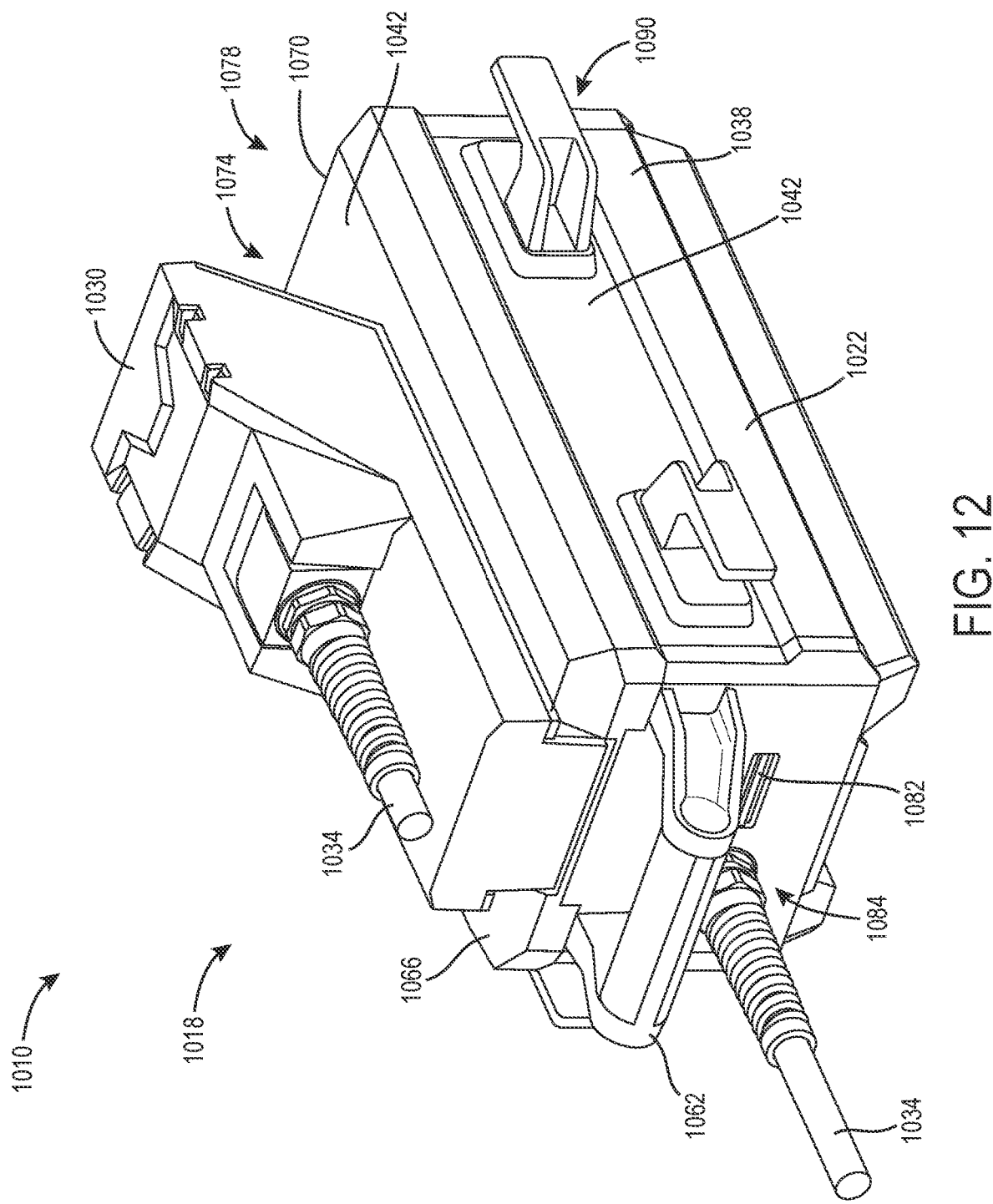
FIG. 12 is a perspective view of another electrical device, such as a power adapter, according to another construction of the disclosure.
Figure 13:
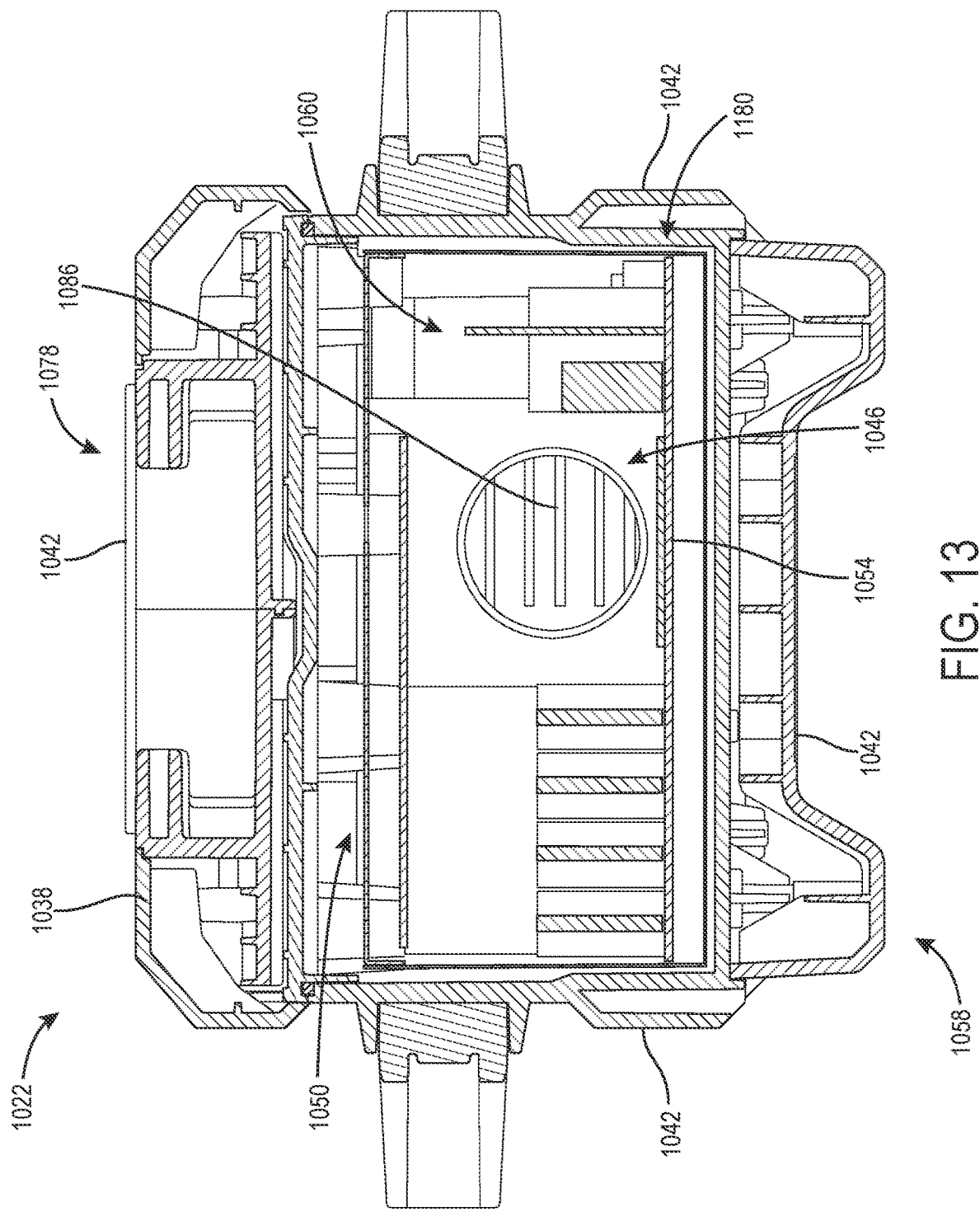
FIG. 13 is a cross-sectional view of the electrical device of FIG. 12, illustrating an interior cavity of the electrical device.

While the heat sinks 150, 250, 350, 450, 550 have been described and illustrated in a charger units 102, 202, 302, 402, 502 of a site light 10, the heat sinks 150, 250, 350, 450, 550 are used in other electrical devices in other embodiments. For example, FIGS. 12-13 illustrate a power adapter assembly 1010 or portions thereof. The illustrated adapter assembly 1010 is an AC/DC adapter assembly 1018 including a power box 1022 operable to receive as input alternating current (AC) power via a power cord (not shown) and supply direct current (DC) power via an adapter 1030 to another electrical device, such as a power tool (e.g., saw). An adapter cord 1034 (only portions shown) electrically connects the adapter 1030 to the power box 1022. In other constructions (not shown), the adapter assembly 1018 may receive power from another power source (e.g., a DC power source (a battery pack), a generator, etc.).

Specifically, the power tool includes a power source support portion that receives and electrically connects either a pack engagement portion of the battery pack or the adapter 1030 to the power tool. In other words, the pack engagement portion may be mechanically (and electrically) connectable to the power source support portion to connect the battery pack to the power tool. Alternatively, the adapter 1030 may be mechanically (and electrically) connectable to the power source support portion to connect the adapter 1030 to the power tool.

With continued reference to FIGS. 12-13, the power box 1022 includes a housing 1038 including a plurality of side walls 1042. The side walls 1042 define an internal compartment 1046 (FIG. 13) within the housing 1038 containing internal components 1050 of the power box 1022. In particular, the power box 1022 includes a power system 1180 having a printed circuit board (PCB) 1054 supported by a first or bottom side 1058 of the power box 1022. In particular, the PCB 1054 includes electrical components 1060 (e.g., one or more of field effect transistors, capacitors, inductors, resistors, a microcontroller to control the transistors, and the like), for converting between AC and DC power. For example, the electrical components 1060 may include a switched mode power supply for converting between AC and DC power. As such, the power system 1180 is operable to selectively provide electrical power to an electrical device such as a power tool.

With reference to FIG. 12, the housing 1038 includes a handle 1062 formed at a first end 1066 opposite a second end 1070, and a storage portion 1074 operable to selectively receive the adapter 1030 for convenient storage when the adapter assembly 1018 is not in use. In additional or alternative embodiments, the storage portion 1074 may be configured to receive the pack engagement portion to selectively couple the battery pack to the power box 1022. The storage portion 1074 is formed in a second or top side 1078 of the power box 1022 opposite the bottom side 1058.

The housing 1038 of the power box 1022 further includes an air inlet 1082 positioned on a third side 1084 of the power box 1022 (FIG. 12). The third side 1084 extends between the first and second sides 1058, 1078, respectively. Additionally, in the illustrated embodiment, the air inlet 1082 is positioned near the handle 1062. The housing 1038 also includes an air outlet 1086 (FIG. 13) positioned on a fourth side 1090 of the housing 1038 opposite the third side 1084. In other embodiments, the air inlet 1082 and outlet 1086 may be positioned on any side 1058, 1078, 1084, 1090 and/or on the same side as each other.

Figure 14:
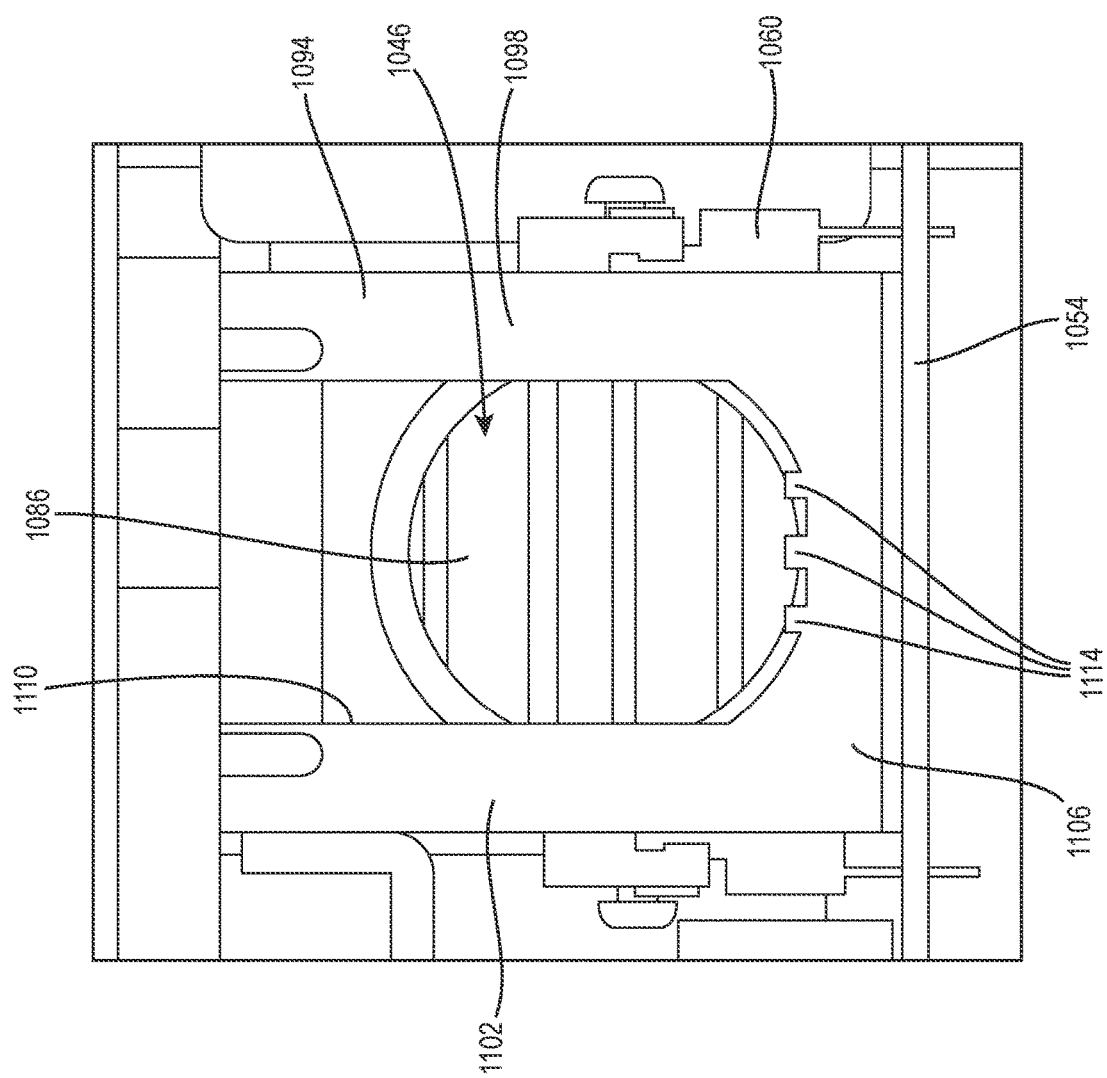
FIG. 14 is an end cross-sectional view of a heat sink according to another embodiment of the disclosure, the heat sink positioned within the interior cavity of FIG. 13.

With reference to FIG. 14, the power box 1022 further includes a heat sink 1094 positioned within the internal compartment 1046 (only a portion of which is shown in FIG. 14). The heat sink 1094 is in heat transfer relationship with the electrical components 1060 for dissipating heat produced within the internal compartment 1046 by the electrical components 1060. Accordingly, the heat sink 1094 is operable to dissipate heat produced in the power box 1022.

The illustrated heat sink 1094 has a first section 1098, a second section 1102 parallel with and spaced from the first section 1098, and an intermediate section 1106 extending therebetween. The first, second, and intermediate sections 1098, 1102, 1106 form a general U-shape having a slot 1110 extending through the heat sink 1094. Further, the illustrated heat sink 1094 includes a plurality of ribs 1114 positioned within the slot 1110. Specifically, the ribs 1114 extend from the intermediate section 1106 toward the top side 1078 of the power box 1022. In other embodiments, the heat sink 1094 may include one or more ribs 1114, positioned on some or all of the sections 1098, 1102, 1106. A side of the heat sink 1094 opposite the intermediate section 1106 is substantially open such that the slot 1110 is in fluid communication with the remaining portion of the internal compartment 1046.

Further, in the illustrated embodiment, the intermediate section 1106 is coupled to the PCB 1054 such that the open side of the heat sink 1094 is in facing relationship with the top side 1078 of the power box 1022. In other embodiments, other sections 1098, 1102, may be coupled to the PCB 1054 such that the open side of the heat sink 1094 is in facing relationship with a different side of the power box 1022.

The heat sink 1094 extends from a first end of the heat sink 1094 to a second end of the heat sink 1094 opposite the first end. The first end is adjacent and aligned with the air inlet 1082. The second end is adjacent and aligned with the air outlet 1086. In other embodiments, the ends of the heat sink 1094 may be offset or completely misaligned with the air inlet 1082 and/or outlet 1086. Air is configured to flow through the power box 1022 from the air inlet 1082 along the heat sink 1094 to the air outlet 1086. In some embodiments, a fan (not shown) may be provided for directing air through the inlet and outlet 1082, 1086, respectively, and along the heat sink 1094 (including within the slot 1110). A rotational axis of the fan may be aligned with the first and second ends of the heat sink 1094. Further, the rotation of the fan may be reversed such that the air inlet becomes the air outlet and vice versa.

Figure 15:
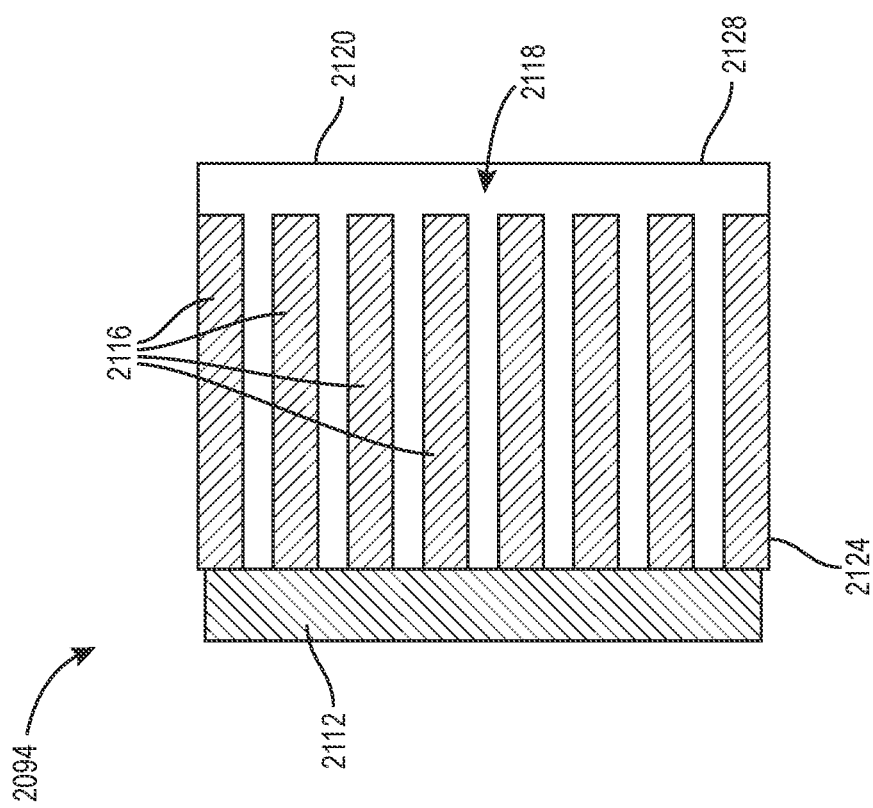
FIG. 15 is a schematic view of a heat sink according to yet still another embodiment of the disclosure.

FIG. 15 schematically illustrates another embodiment of a heat sink 2094, with like components and features as the embodiment of the heat sink 1094 shown in FIG. 14 being labeled with like reference numerals plus "1000." The heat sink 2094 is an alternative heat sink that is used within the power box 1022 in some embodiments of the power adapter assembly 1010.

The heat sink 2094 includes a body 2112 and a plurality of fins 2116 extending from the body 2112. In the illustrated embodiment, the heat sink 2094 includes eight fins 2116; however, in other embodiments, the heat sink 2094 may include one or more fins 2116. Further, a case 2120 surrounds the fins 2116 (i.e., a finned portion 2118) of the heat sink 2094. In the illustrated embodiment, the case 2120 is formed by plastic. In other embodiments, the case 2120 may be formed by metal, etc. Further, in the illustrated embodiment, a side 2128 of the case 2120 is spaced from each end of the fins 2116.

The case 2120 and the heat sink 2094 are positioned in the internal compartment 1094 of the adapter assembly 1018 of FIGS. 12-13. In particular, a first end of the case 2120 and the heat sink 2094 is adjacent and aligned with the air inlet 1082. A second end opposite the first end of the case 2120 and the heat sink 2094 is adjacent and aligned with the air outlet 1086. As such, the case 2120 may form a tunnel, with the heat sink 2094 positioned within the tunnel, for directing the air flow over the finned portion 2118 of the heat sink 2094. A bottom end 2124 of the case 2120 may be coupled to the PCB 1054 of the adapter assembly 1018 for securing the case 2120 within the internal compartment 1046. In other embodiments, the heat sink 2094 is rotated 90 degrees counter clockwise such that the base 2112 is coupled to the PCB 1054 when positioned in the adapter assembly 1018.

Although the heat sinks 1094, 2094 have been described and illustrated in the adapter assembly 1018, the heat sinks 1094, 2094 are also used in other electrical devices including the site light 10 (e.g., in place of one of the previously described heat sinks 150, 250, 350, 450, 550), as described above.

Accordingly, various embodiments of a heat sink are described herein that enable heat dissipation produced in a sealed housing of an electrical device. Although the disclosure has been described in detail with reference to certain embodiments, variations and modifications exist within the scope and spirit of one or more independent aspects of the disclosure as described.

Various features of the disclosure are set forth in the following claims.

What is claimed is:

1. A charger for an electrical device, the charger comprising:
   a housing defining an interior cavity;
   one or more openings formed in the housing; and
   a heat sink disposed in the interior cavity of the housing and operable to dissipate heat produced in the housing, the heat sink positioned in a facing relationship with the one or more openings such that the heat sink is at least partially exposed to an exterior, the heat sink in heat transfer relationship with components of charger electronics of the charger, the heat sink including a fin portion having one or more fins extending to the one or more openings, at least one fin including a flange extending therefrom, the flange engaging the housing at an interface.

2. The charger of claim 1, wherein the housing includes a longitudinal axis extending therethrough, and wherein the one or more openings extends along parallel with or perpendicular to the longitudinal axis.

3. The charger of claim 2, wherein each of the one or more openings has a width relative to the longitudinal axis, and wherein each width is different.

4. The charger of claim 1, wherein the heat sink defines a heat sink interior cavity in fluid communication with the exterior of the housing, and a seal is disposed at the interface between the flange and the housing separating the heat sink interior cavity and the interior cavity of the housing.

5. The charger of claim 1, further comprising a printed circuit board having the charger electronics and positioned within the interior cavity, the heat sink coupled to the printed circuit board.

6. The charger of claim 1, wherein the housing includes a plurality of walls forming the interior cavity, wherein the plurality of walls defines a plurality of sides and an end connecting the plurality of sides of the housing, and wherein the one or more openings is positioned on one of one of the plurality of sides and the end of the housing.

7. A site light comprising:
   a main housing having a plurality of inner surfaces defining a first cavity;
   a charger supported in the main housing and positioned within the first cavity, the charger including
      a charger housing defining a charger interior cavity;
      one or more openings formed in the charger housing; and
      a heat sink disposed in the interior cavity of the charger housing and operable to dissipate heat produced in the charger housing, the heat sink positioned in a facing relationship with the one or more openings such that the heat sink is at least partially exposed to an exterior, the heat sink in heat transfer relationship with components of charger electronics of the charger, the heat sink including a fin portion having one or more fins that extend to the one or more openings, wherein at least one fin includes a flange extending from the fin, the flange engaging the charger housing at an interface; and
   a fan supported by the charger housing, wherein the fan is positioned exterior to the charger housing, and wherein the fan is operable to pass air over the one or more openings.

8. The site light of claim 7, wherein the charger housing includes a longitudinal axis extending therethrough, and wherein the one or more openings extends along parallel with or perpendicular to the longitudinal axis.

9. The site light of claim 8, wherein each of the one or more openings has a width relative to the longitudinal axis, and wherein each width is different.

10. The site light of claim 7, wherein a seal is disposed at the interface between the flange and the charger housing separating the first cavity of the main housing and the charger interior cavity.

11. The site light of claim 7, further comprising a printed circuit board having the charger electronics and positioned within the charger housing, the heat sink coupled to the printed circuit board.

12. The site light of claim 7, wherein the fan has a rotational axis that extends parallel with a longitudinal axis of the one or more openings.

13. A site light comprising:
 a main housing having a plurality of inner surfaces defining a first cavity; and
 a charger supported in the main housing and positioned within the first cavity, the charger including
  a charger housing defining a charger interior cavity;
  one or more openings formed in the charger housing; and
 a heat sink disposed in the charger interior cavity of the charger housing and operable to dissipate heat produced in the charger housing, the heat sink positioned in a facing relationship with the one or more openings such that the heat sink is at least partially exposed to an exterior, the heat sink in heat transfer relationship with components of charger electronics of the charger, the heat sink having one or fins and at least one fin includes a flange extending from the fin, the flange engaging the charger housing at an interface, and a seal is disposed between the flange and the charger housing.

* * * * *